(12) United States Patent
Meyer et al.

(10) Patent No.: US 8,907,480 B2
(45) Date of Patent: Dec. 9, 2014

(54) CHIP ARRANGEMENTS

(71) Applicant: Intel Mobile Communications GmbH, Neubiberg (DE)

(72) Inventors: Thorsten Meyer, Regensburg (DE); Hans-Joachim Barth, Munich (DE); Reinhard Mahnkopf, Oberhaching (DE); Sven Albers, Regensburg (DE); Andreas Augustin, Munich (DE); Christian Mueller, Bottrop (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/802,848

(22) Filed: Mar. 14, 2013

(65) Prior Publication Data

US 2014/0264832 A1    Sep. 18, 2014

(51) Int. Cl.
*H01L 23/34* (2006.01)
*H01L 23/00* (2006.01)

(52) U.S. Cl.
CPC .................................... *H01L 24/17* (2013.01)
USPC ............ 257/737; 257/E23.011; 257/E21.499; 257/E23.01

(58) Field of Classification Search
CPC .................. H01L 2224/73265; H01L 23/481; H01L 25/0657; H01L 2225/06541; H01L 2224/48145; H01L 2225/06513
See application file for complete search history.

(56) References Cited

U.S. PATENT DOCUMENTS 8,039,303 B2 * 10/2011 Shim et al. .................... 438/107
8,143,726 B2 *  3/2012 Knickerbocker et al. ..... 257/777

OTHER PUBLICATIONS

Norm Robson et al. "Electrically Programmable Fuse (eFUSE): From Memory Redundancy to Autonomic Chips", IEEE 2007 Custom Integrated Circuits Conference (CICC), pp. 799-804.
JEDEC Standard, Wide I/O Single Data Rate (Wide I/O SDR), JEDEC Standard No. 229, Dec. 2011, pp. 1-70.
Jung-Sik Kim et al. "A 1.2 V 12.8 GB/s 2 Gb Mobile Wide-I/O DRAM With 4×128 I/Os Using TSV Based Stacking", IEEE Journal of Solid-State Circuits, vol. 47, No. 1, Jan. 2012, pp. 107-116.

* cited by examiner

*Primary Examiner* — Zandra Smith
*Assistant Examiner* — Paul Patton

(57) ABSTRACT

A chip arrangement may include: a first chip including a first contact, a second contact, and a redistribution structure electrically coupling the first contact to the second contact; a second chip including a contact; and a plurality of interconnects electrically coupled to the second contact of the first chip, wherein at least one interconnect of the plurality of interconnects electrically couples the second contact of the first chip to the contact of the second chip.

23 Claims, 12 Drawing Sheets

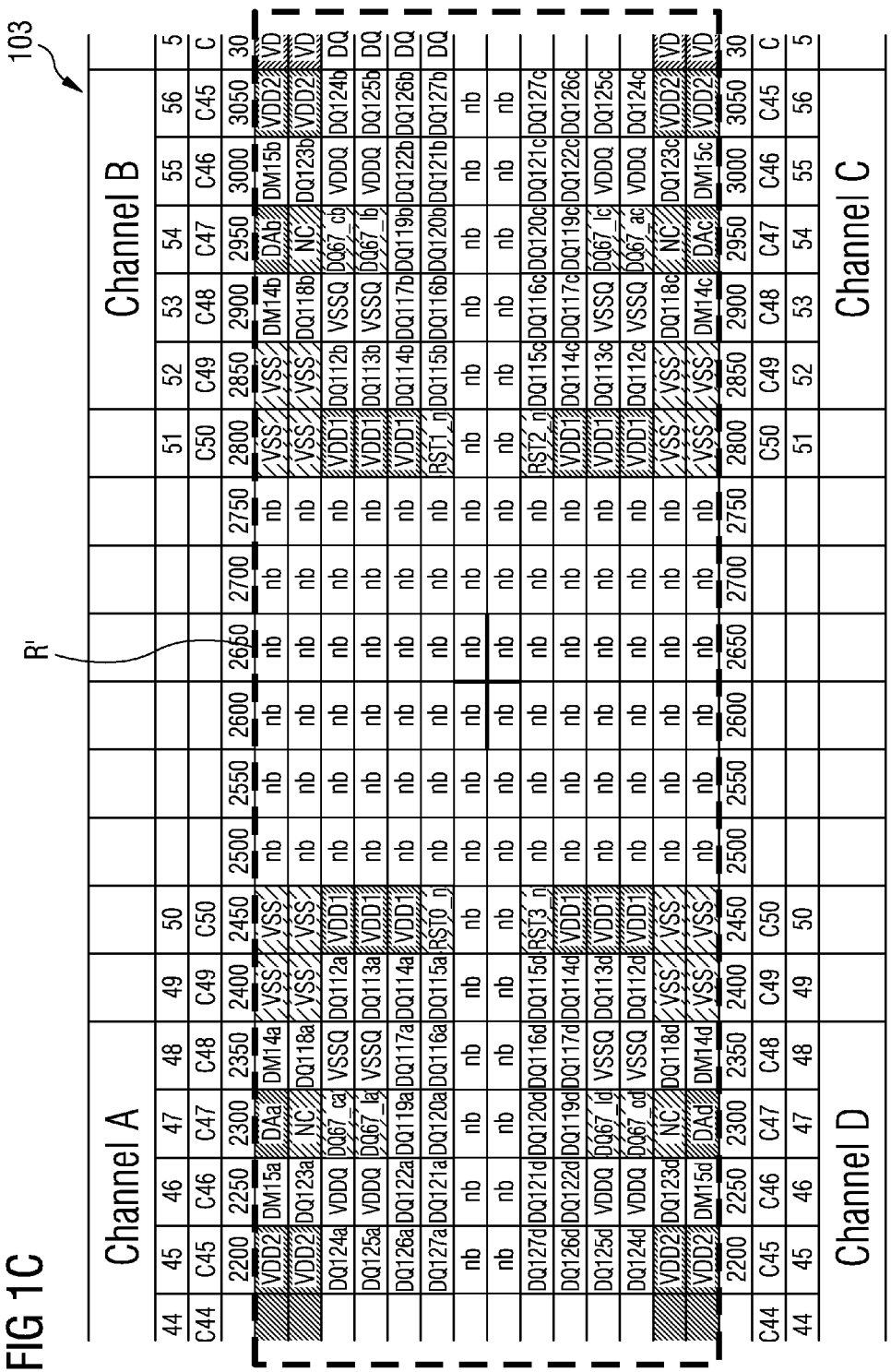

900

| Micropillar Type | Count | Description |
|---|---|---|
| VDD1 | 6 | Core Power |
| VDD2 | 20 | Core Power |
| VDDQ | 16 | I/O Power |
| VSS | 24 | Core Ground |
| VSSQ | 16 | I/O Ground |
| DQ | 128 | Data |
| DQS | 16 | Data Strobe DQS_t, DQS_c (unused in current definition) |
| DM | 16 | Data Mask |
| ADDR | 19 | Address (0-16), Bank (0-1) |
| CMD | 4 | RAS_n, CAS_n, WE_n, RESET |
| CK | 2 | CK_t, CK_c (unused in current definition) |
| CS | 4 | Chip (Rank) Select |
| CKE | 4 | Clock Enable |
| TEST | 1/0 | Memory DA Test Mode Enable (only on channel A, location is DA(o) on other channels) |
| SER | 5 | Serial Boundary Scan micropillars (uses CS to select rank) |
| KEY | 1 | Vendor Specific micropillar in channel A, n/c in channel B, Scan Enable in channel C, missing micropillar in channel D. |
| NC | 9 | no connect |
| DA | 1 | Direct Access (all SoC vendors will provide direct connection to memory through substrate) |
| DA(o) | 8/9 | Direct Access (optional, SoC vendors may or may not provide direct connections to memory through substrate) |
| Total | 300 | 300 I/Os per block (×4 = 1200 interconnects per memory total) |

◯ : connections possibly don't have to be multiplied

FIG. 9

CHIP ARRANGEMENTS

TECHNICAL FIELD

Various aspects relate to chip arrangements.

BACKGROUND

A memory chip may be essential to the proper functioning of many devices. A memory chip may, for example, be stacked on to a logic chip, thereby enabling data to be retrieved from and/or written to the memory chip, for example, via a signal exchanged between the logic chip and the memory chip.

A speed at which the memory chip and/or the logic chip may operate and/or interoperate with each other may have to keep pace with an ever increasing demand for higher data rates and/or higher bandwidth (e.g. in multimedia applications). Higher bandwidth in a memory chip and/or a logic chip may, for example, be achieved with a use of a larger number of interconnects (e.g. hundreds, or thousands, or even more interconnects) between the memory chip and the logic chip that may, for example, couple (e.g. electrically couple) the memory chip and the logic chip to each other.

The large number of interconnects may have to be connected to the memory chip and/or the logic chip in one step in a process flow (e.g. by soldering, e.g. by reflow soldering). This may be a challenge, for example, since the large number of interconnects may have dimensions (e.g. a height and/or a width) in the order of microns. Accordingly, an interconnect that may fail to couple (e.g. electrically couple) the memory chip and the logic chip to each other may cause a yield loss in the memory chip and/or the logic chip. New ways of coupling (e.g. electrically coupling) a memory chip and a logic chip to each other may be needed.

SUMMARY

A chip arrangement is provided, which may include: a first chip including a first contact, a second contact, and a redistribution structure electrically coupling the first contact to the second contact; a second chip including a contact; and a plurality of interconnects electrically coupled to the second contact of the first chip, wherein at least one interconnect of the plurality of interconnects electrically couples the second contact of the first chip to the contact of the second chip.

Furthermore, a chip arrangement is provided, which may include: a first chip including a first contact, a second contact, and a redistribution structure electrically coupling the first contact to the second contact; a second chip including a contact; and a plurality of interconnects electrically coupled to the contact of the second chip, wherein at least one interconnect of the plurality of interconnects electrically couples the contact of the second chip to the second contact of the first chip.

Furthermore, a chip arrangement is provided, which may include: a first chip including a first contact, a second contact, and a redistribution structure electrically coupling the first contact to the second contact; a second chip including a first contact, a second contact, and a redistribution structure electrically coupling the first contact to the second contact; a first interconnect electrically coupled to at least one of the first contact of the first chip and the first contact of the second chip; and a second interconnect electrically coupled to at least one of the second contact of the first chip and the second contact of the second chip, wherein at least one of the first interconnect and the second interconnect electrically couples the first contact of the first chip to the first contact of the second chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 1A to FIG. 1D show various views of conventional chip arrangements including a logic chip and at least one memory chip.

FIG. 9 shows a table illustrating input/output (I/O) connections of a wide I/O logic-memory interface.

DESCRIPTION

Figure 1A:
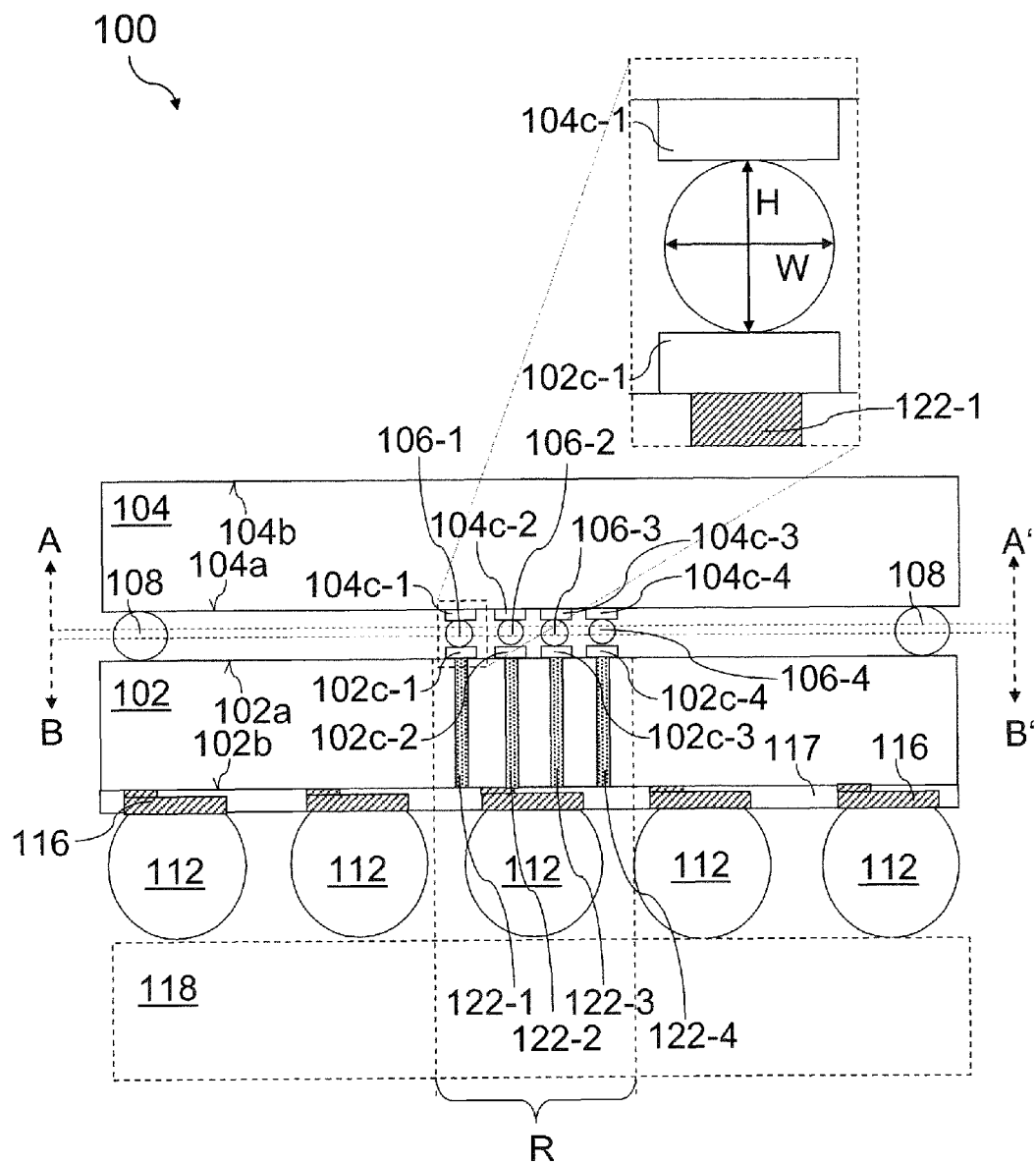

The following detailed description refers to the accompanying drawings that show, by way of illustration, specific details and aspects in which the invention may be practised. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Modern electronic devices (e.g. cell phones, computers, etc.) may include a chip arrangement, that may include a logic chip and a memory chip. The logic chip may include, or may be, a processor (e.g. a CPU (central processing unit), a GPU (graphics processing unit), an AP (application processor), a base band modem, a micro controller, or the like) that may, for example, retrieve data from and/or store data in the memory chip.

FIG. 1A shows a cross-sectional view of a conventional chip arrangement 100 including a logic chip 102 and a memory chip 104.

The logic chip 102 may have a first side 102a and a second side 102b opposite the first side 102a. The first side 102a and the second side 102b of the logic chip 102 may include, or may be, a backside and a frontside (or active side) of the logic chip 102, respectively. By way of another example, the first side 102a and the second side 102b of the logic chip 102 may include, or may be, a top surface and a bottom surface of the logic chip 102, respectively.

The logic chip 102 may include at least one contact 102c-1, 102c-2, 102c-3, 102c-4 formed at (e.g. disposed at or over) the first side 102a of the logic chip 102. Four contacts 102c-1, 102c-2, 102c-3, and 102c-4 are shown as an example, however the number of contacts 102c-x (here and in the following, a small "x" in a reference numeral such as "102c-x" may represent an index that may assume all values between "1" and a maximum value) may be less than four, or may be greater than four, and may, for example, be five, six, seven eight, nine, tens, hundreds, or thousands of contacts formed at (e.g. disposed at or over) the first side 102a of the logic chip 102.

The logic chip 102 may include at least one through-via 122-1, 122-2, 122-3, 122-4. Four through-vias 122-1, 122-2, 122-3, and 122-4 are shown as an example, however the number of through-vias 122 may be less than four, or may be greater than four, and may, for example, be five, six, seven eight, nine, tens, hundreds, or thousands of through-vias. The number of through-vias 122 may be the same as the number of contacts 102c.

The at least one through-via 122-1, 122-2, 122-3, 122-4 may be electrically coupled to the at least one contact 102c-1, 102c-2, 102c-3, 102c-4 of the logic chip 102. For example, a respective through-via of the logic chip 102 may be coupled (e.g. electrically coupled) to a respective contact of the logic chip 102. For example, in the chip arrangement 100 shown in FIG. 1A, the through-via 122-1 of the logic chip 102 may be coupled (e.g. electrically coupled) to the contact 102c-1 of the logic chip 102. In like manner, the through-via 122-2 of the logic chip 102 may be coupled (e.g. electrically coupled) to the contact 102c-2 of the logic chip 102. A similar observation may be made about the through-vias 122-3 and 122-4 of the logic chip 102, and the contacts 102c-3 and 102c-4 of the logic chip 102, respectively.

The memory chip 104 may have a first side 104a and a second side 104b opposite the first side 104a. The first side 104a and the second side 104b of the memory chip 104 may include, or may be, a frontside and a backside of the memory chip 104, respectively. By way of another example, the first side 104a and the second side 104b of the memory chip 104 may include, or may be, a bottom surface and a top surface of the memory chip 104, respectively.

The memory chip 104 may include at least one contact 104c-1, 104c-2, 104c-3, 104c-4 formed at (e.g. disposed at or over) the first side 104a of the memory chip 104. Only four contacts 104c-1, 104c-2, 104c-3, and 104c-4 are shown as an example, however the number of contacts 104c-x may be less than four, or may be greater than four, and may, for example, be five, six, seven eight, nine, tens, hundreds, or thousands of contacts formed at (e.g. disposed at or over) the first side 104a of the memory chip 104. The number of contacts 104c-x of the memory chip 104 may be the same as the number of contacts 102c-x of the logic chip 102.

The memory chip 104 may include any one of, or any combination of, a volatile memory chip (e.g. a random access memory (RAM) chip, such as a dynamic random access memory (DRAM) chip, a static random access memory (SRAM) chip, etc.) and a non-volatile memory chip (e.g. a read only memory (ROM) chip, such as an erasable programmable read only memory (EPROM) chip, an electronically erasable programmable read only memory (EEPROM) chip, etc.), although other types of memory chips may be possible as well.

The memory chip 104 may have a distributed architecture, where various components of the memory chip 104 may be arranged remote from one another, but may be accessed by the logic chip 102.

The logic chip 102 and the memory chip 104 may be arranged in the chip arrangement 100 such that the first side 102a of the logic chip 102 may face the first side 104a of the memory chip 104, as shown in FIG. 1A. As described above, the first side 102a of the logic chip 102 may be a backside of the logic chip 102, and the first side 104a of the memory chip 104 may be a frontside of the memory chip 104. In such an example, the logic chip 102 and the memory chip 104 may be arranged in a backside-to-frontside arrangement. The logic chip 102 may be arranged as in a typical flip chip arrangement with the frontside 102b facing down (facing away from an interface between the logic chip 102 and the memory chip 104), e.g. towards a ball grid array as shown in FIG. 1A.

The logic chip 102 and the memory chip 104 may be coupled (e.g. electrically coupled) to each other, for example, via at least one interconnect 106-1, 106-2, 106-3, 106-4. Only four interconnects 106-1, 106-2, 106-3, and 106-4 are shown as an example in the chip arrangement 100, however the number of interconnects may be less than four, or may be greater than four, and may, for example, be five, six, seven eight, nine, tens, hundreds, or thousands of interconnects. The number of interconnects 106-x may be the same as the number of contacts 102c-x of the logic chip 102 and the number of contacts 104c-x of the memory chip 104.

The at least one interconnect 106-1, 106-2, 106-3, 106-4 may serve to electrically couple the logic chip 102 to the memory chip 104. More particularly, the at least one interconnect 106-1, 106-2, 106-3, 106-4 may serve to electrically couple the at least one contact 102c-1, 102c-2, 102c-3, 102c-4 of the logic chip 102 to the at least one contact 104c-1, 104c-2, 104c-3, 104c-4 of the memory chip 104.

As shown in FIG. 1A, a respective interconnect may couple (e.g. electrically couple) a respective contact of the logic chip 102 to a respective contact of the memory chip 104. For example, in the chip arrangement 100 shown in FIG. 1A, the interconnect 106-1 may couple (e.g. electrically couple) the contact 102c-1 of the logic chip 102 and the contact 104c-1 of the memory chip 104 to each other. In like manner, the interconnect 106-2 may couple (e.g. electrically couple) the contact 102c-2 of the logic chip 102 and the contact 104c-2 of the memory chip 104 to each other. A similar observation may be made about the interconnects 106-3 and 106-4, the contacts 102c-3 and 102c-4 of the logic chip 102, and the contacts 104c-3 and 104c-4 of the memory chip 104.

The at least one interconnect 106-1, 106-2, 106-3, 106-4 may include, or may be, a bump, for example, a solder bump, a micro-bump (e.g. micro-solder bump), a flip-chip bump (e.g. a micro flip-chip bump) or a pillar bump (e.g. a micro-pillar bump).

The at least one interconnect 106-1, 106-2, 106-3, 106-4 may have a height H, which may, for example, refer to the widest extent of the at least one interconnect 106-1, 106-2, 106-3, 106-4 measured in a direction perpendicular to the first side 102a of the logic chip 102 and/or a direction perpendicular to the first side 104a of the memory chip 104. The height H of the at least one interconnect 106-1, 106-2, 106-3, 106-4 may be less than or equal to about 50 µm, e.g. less than or equal to about 25 µm, e.g. less than or equal to about 20 µm, e.g. less than or equal to about 15 µm, e.g. in the range from about 15 µm to about 25 µm, for example about 20 µm. Alternatively, the height H may have other values. The height H may, for example, depend on a distance between the interconnects.

The at least one interconnect 106-1, 106-2, 106-3, 106-4 may have a width W, which may, for example, refer to the widest extent of the at least one interconnect 106-1, 106-2, 106-3, 106-4 measured in a direction perpendicular to the height H. The width W of the at least one interconnect 106-1, 106-2, 106-3, 106-4 may be less than or equal to about 30 µm, e.g. less than or equal to about 20 µm, e.g. less than or equal to about 17 µm, e.g. less than or equal to about 15 µm, e.g. in the range from about 15 µm to about 19 µm, e.g. about 17 µm. Alternatively, the width W may have other values. The width W may, for example, depend on a distance between the interconnects.

The at least one contact 102c-1, 102c-2, 102c-3, 102c-4 of the logic chip 102 and the at least one contact 104c-1, 104c-2, 104c-3, 104c-4 of the memory chip 104 may be arranged in a region R of the logic chip 102 and the memory chip 104, respectively. The region R may, for example, include, or may be, a region that may be at or near a center of the logic chip 102 and/or the memory chip 104.

The chip arrangement 100 may include at least one support bump 108 that may, for example, provide mechanical support to the memory chip 104 and/or the logic chip 102. The at least one support bump 108 may be disposed between the logic chip 102 and the memory chip 104. The at least one support bump 108 may be disposed at or close to an edge of the logic chip 102 and/or the memory chip 104.

The chip arrangement 100 may include a plurality of solder balls 112. The plurality of solder balls 112 may form a ball grid array. The logic chip 102 may be electrically connected to at least one solder ball of the plurality of solder balls 112 by means of a redistribution layer (RDL) 116. The RDL 116 may, for example, be partially or fully disposed within an insulating layer 117 (e.g. a dielectric layer). The RDL 116 may redistribute and/or re-map electrical connections from the logic chip 102 to the plurality of solder balls 112. The chip arrangement 100 shown in FIG. 1A may be electrically connected to a printed circuit board (PCB) 118, for example, via the plurality of solder balls 112.

Figure 1B:
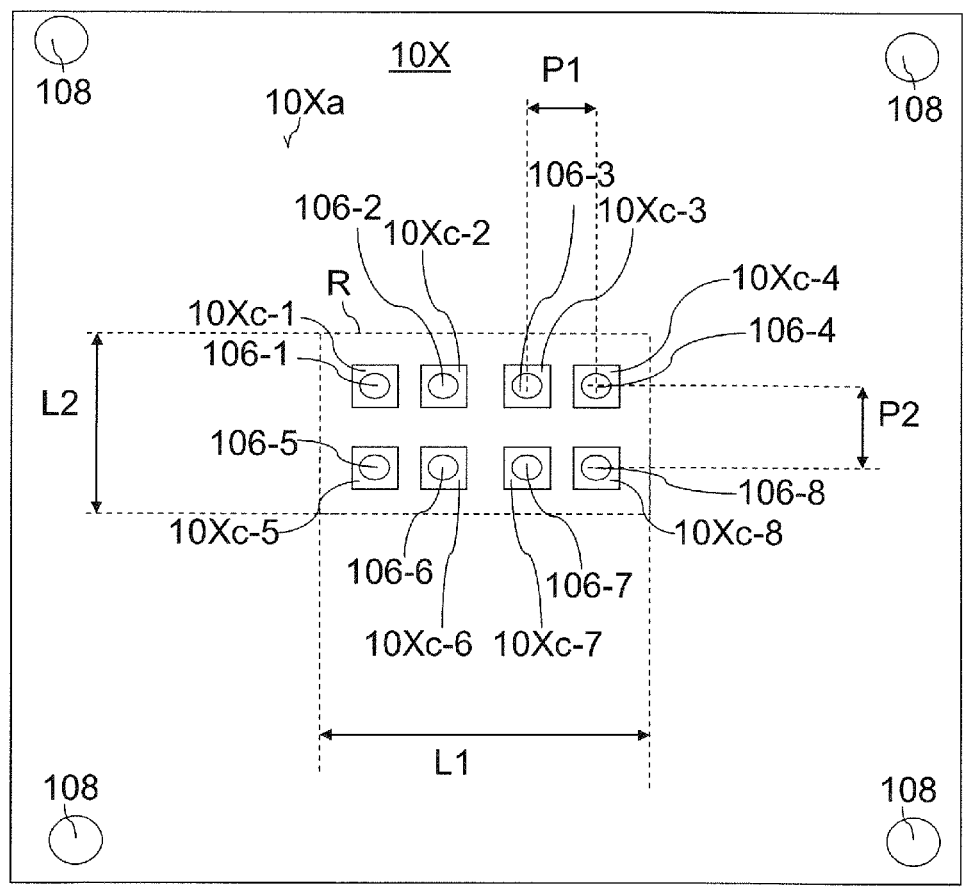

FIG. 1B shows a view 101 of the chip arrangement 100 along the line A-A' or the line B-B' in FIG. 1A.

The view 101 shows a chip 10X, which may, for example, be identified with the logic chip 102 and/or the memory chip 104 shown in FIG. 1A. The chip 10X may have a first side 10Xa, which may, for example, be identified with the first side 102a of the logic chip 102 and/or the first side 104a of the memory chip 104.

The view 101 shows at least one contact 10Xc-1 to 10Xc-8, which may, for example, include or be the at least one contact of the logic chip 102 and/or the at least one contact of the memory chip 104 shown in FIG. 1A. For example, the at least one contact 10Xc-1, 10Xc-2, 102 and/or the at least one contact 104c-1, 104c-2, 104c-3, 104c-4 of the memory chip 104 shown in FIG. 1B.

The view 101 shows at least one interconnect 106-1 to 106-8 formed at (e.g. disposed over) the at least one contact 10Xc-1 to 10Xc-8. The at least one interconnect 106-1 to 106-8 may be coupled (e.g. electrically coupled) to the at least one contact 10Xc-1 to 10Xc-8. For example, the at least one interconnect 106-1, 106-2, 106-4 and 106-4 shown in FIG. 1B may be the at least one interconnect 106-1, 106-2, 106-4 and 106-4 shown in FIG. 1A.

As shown in FIG. 1B, the at least one interconnect 106-1 to 106-8 may be arranged in a region R that may be at or near a center of the logic chip 102 and/or the memory chip 104. Eight interconnects 106-1 to 106-8 are shown as an example, however the number of interconnects arranged in the region R may be less than eight or may be greater than eight, and may, for example, be nine, tens, hundreds, or thousands of interconnects.

The region R may have a first extent L1 along a first direction and a second extent L2 along a second direction, which may be perpendicular to the first direction.

As shown in FIG. 1B, the at least one interconnect 106-1 to 106-8 may be arranged in an array that may include rows and columns A first pitch P1 may refer to a distance between a center of an interconnect of the at least one interconnect 106-1 to 106-8 to a center of an adjacent interconnect (e.g. directly adjacent interconnect) in the direction of the first extent L1. The first pitch P1 may, for example, be in the range from about 40 µm to about 60 µm, for example about 50 µm.

A second pitch P2 may refer to a distance between a center of an interconnect of the at least one interconnect 106-1 to 106-8 to a center of an adjacent interconnect (e.g. directly adjacent interconnect) in the direction of the second extent L2. The second pitch P2 may, for example, be in the range from about 30 µm to about 50 µm, for example about 40 µm.

The first and second extents L1 and L2 of the region R may, for example, depend on the number of contacts 10Xc or interconnects 106-x along the first and second directions, and the pitches P1, P2 and/or dimensions of the contacts 10Xc or interconnects 106-x along the first and second directions. For example, in case of a logic chip 102 and/or memory chip 104 having a wide I/O logic-memory interface according to the JEDEC (Joint Electron Devices Engineering Council) standard with 1200 contacts arranged in four blocks (corresponding to four channels of the interface), each block having 300 interconnects arranged in 6 rows×50 columns (the rows corresponding to the first direction, and the columns corresponding to the second direction), and a 50 μm pitch in the row direction (first pitch P1) and a 40 μm pitch in the column direction (second pitch P2), the first extent L1 may be about 5.25 mm+W and the second extent L2 may be about 0.52 mm+W, wherein W may be the width of an interconnect 106-*x* as shown in FIG. 1A (e.g. diameter of one micropillar). In other cases, L1 and/or L2 may have other values.

As described above, the logic chip 102 may retrieve data from and/or store data in the memory chip 104. This may be achieved, for example, by means of a signal exchanged between the logic chip 102 and the memory chip 104. For example, the logic chip 102 may provide a write instruction to, for example, the memory chip 104 to store data in the memory chip 104. By way of another example, the logic chip 102 may provide a read instruction to, for example, the memory chip 104 to retrieve data from the memory chip 104.

The signal may be exchanged between the logic chip 102 and the memory chip 104 via a data path. The data path may, for example, be a passageway for information to travel to and/or from the memory chip 104. When information is written to the memory chip 104, the data path may function as an input path to the memory chip 104. When information is read from the memory chip 104, the data path may function as an output path from the memory chip 104. A data path may also be referred to as an input/output (I/O) path or input/output (I/O).

An I/O may include or be provided by, for example, the at least one through-via 122-1, 122-2, 122-3, 122-4. Accordingly, the number of I/Os between the logic chip 102 and the memory chip 104 may be substantially equal to the number of through-vias included in the logic chip 102. As described above, a respective interconnect may be coupled (e.g. electrically coupled) with a respective through-via of the logic chip 102 by means of, for example, a respective contact of the logic chip 102. For example, as shown in FIG. 1A, the interconnect 106-1 may be coupled (e.g. electrically coupled) with the through-via 122-1 of the logic chip 102 by means of, for example, the contact 102*c*-1 of the logic chip 102. For example, a signal on a respective I/O (e.g. the through-via 122-1) may be exchanged between the logic chip 102 and the memory chip 104 via one signal path (e.g. via the interconnect 106-1).

The memory chip 104 may, for example, be classified by the number of I/Os that may be provided. The greater the number of I/Os, the greater the amount of information that may be read from and/or written to the memory chip 104 per unit time. In other words, the greater the number of I/Os, the greater the bandwidth of the memory chip 104 may be. A memory chip 104 (e.g. a DRAM chip) which has an I/O interface designed in accordance with the wide I/O interface standard given by JEDEC may be referred to as a "wide I/O" memory chip. In an example, the memory chip 104 may include, or may be, a wide I/O memory chip (e.g. a wide I/O RAM chip, e.g. a wide I/O DRAM chip).

A wide I/O memory chip may, for example, be useful in the mobile industry (e.g. mobile telecommunications industry). For example, a rise in popularity of multimedia applications may demand high bandwidth, and consequently a use of a wide I/O memory chip that may have a high bandwidth may be desirable.

Wide I/O chip standards may also stipulate the use of a wide I/O memory chip that may have a high bandwidth. For example, such a standard may be designed for higher bandwidth with lowered frequencies, which may consume less power compared to other memory chips. As described above, the requirement for higher bandwidth may require a large number of I/Os between the memory chip 104 and the logic chip 102. For example, the JEDEC (Joint Electron Devices Engineering Council) Wide I/O interface standard mentioned above may stipulate a use of 1200 I/Os. In such an example, the number of interconnects 106-*x* arranged in the region R of the view 101 shown in FIG. 1B may be 1200, as mentioned above. In such an example, the 1200 I/Os may be arranged in the region R, the region R including four blocks, each block corresponding to one of four channels ("Channel A", "Channel B", "Channel C", "Channel D") of the interface and having 300 I/Os arranged in 6 rows×50 columns, as mentioned above.

For example, FIG. 1C shows a channel map 103 of the Wide I/O interface according to the JEDEC standard, wherein the region R' shown in FIG. 1C may, for example, be identified with a part of the region R shown in FIG. 1A and FIG. 1B. For example, FIG. 1C shows a section of the entire wide I/O interface. Only columns C44-C50 of the 50 columns C1-C50 of Channels A and D are shown, and only columns C50-C44 of the columns C50-C1 of Channels B and C are shown.

As shown in the chip arrangement of FIG. 1A, the memory chip 104 (e.g. wide I/O DRAM) may be arranged above the logic chip 102. Accordingly, a process flow that may manufacture the chip arrangement 100 may require the memory chip 104 (e.g. wide I/O DRAM) to be picked and placed, for example, on top of the logic chip 102. In another example, the converse may be true, namely, the logic chip 102 may be picked and placed, for example, on top of the memory chip 104 (e.g. wide I/O memory, such as, wide I/O DRAM).

A conventional chip arrangement may include a plurality of memory chips and a logic chip.

Figure 1D:
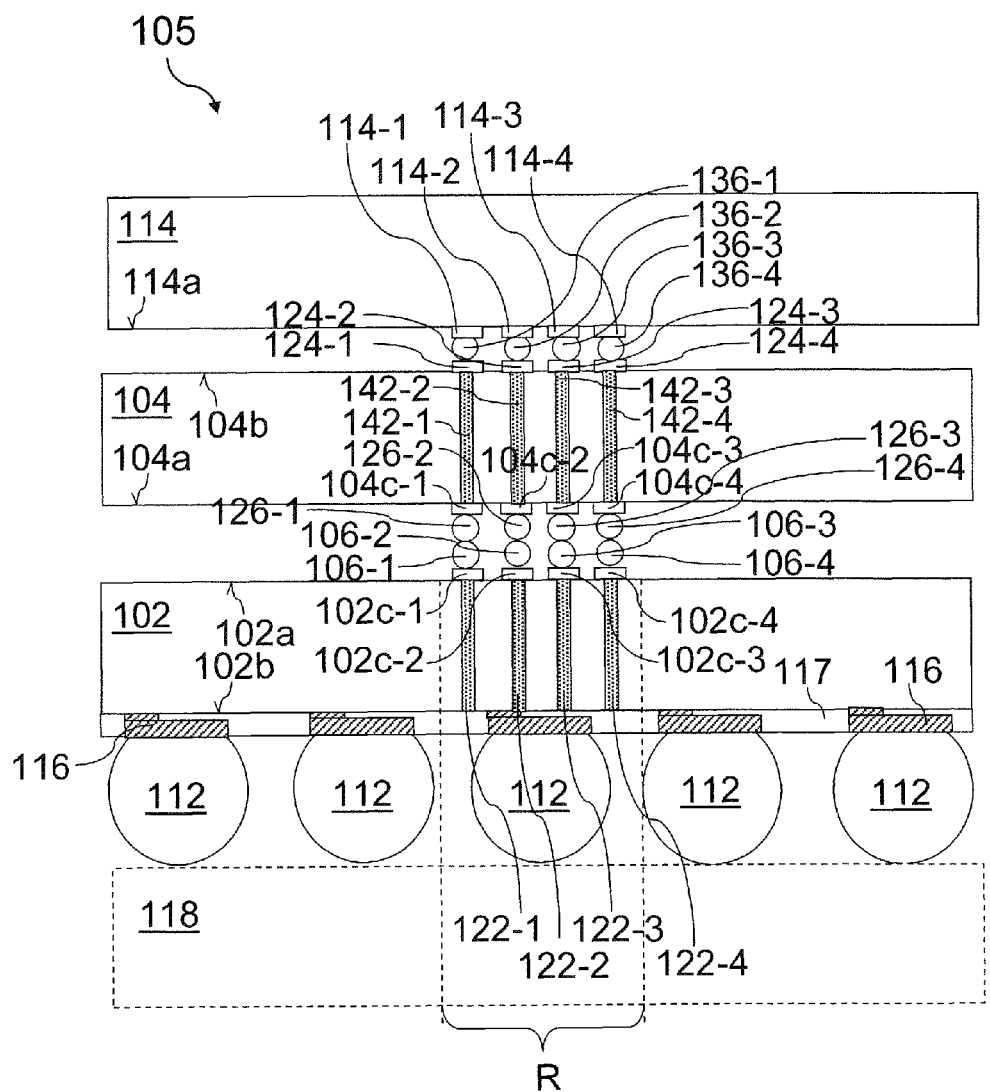

FIG. 1D shows a conventional chip arrangement 105 including a plurality of memory chips 104, 114 and a logic chip 102.

Reference signs in FIG. 1D that are the same as in FIG. 1A denote the same or similar elements as in FIG. 1A. Thus, those elements will not be described in detail again here; reference is made to the description above. Differences between FIG. 1D and FIG. 1A are described below.

The chip arrangement 105 may include the logic chip 102, the memory chip 104, and a second memory chip 114 stacked on the memory chip 104.

As shown in FIG. 1D, the memory chip 104 may be stacked on the logic chip 102. The memory chip 104 and the logic chip 102 may be coupled (e.g. electrically coupled) via the at least one interconnect 106-1, 106-2, 106-3, 106-4 formed at (e.g. disposed over) the first side 102*a* of the logic chip 102 and at least one interconnect 126-1, 126-2, 126-3, 126-4 formed at (e.g. disposed over) the at least one interconnect 106-1, 106-2, 106-3, 106-4. For example, as shown in FIG. 1D, the interconnect 126-1 may be formed at (e.g. disposed over) the interconnect 106-1. Accordingly, the memory chip 104 and the logic chip 102 may be coupled (e.g. electrically coupled) to each other via the at least one interconnect 126-1, 126-2, 126-3, 126-4 and the at least one interconnect 106-1, 106-2, 106-3, 106-4.

The at least one interconnect 126-1, 126-2, 126-3, 126-4 may include, or may be, a bump, for example, a solder bump, a micro-bump (e.g. micro-solder bump), a flip-chip bump (e.g. a micro flip-chip bump) or a pillar bump (e.g. a micro-pillar bump).

In an example where the at least one interconnect 126-1, 126-2, 126-3, 126-4 and the at least one interconnect 106-1, 106-2, 106-3, 106-4 may be bumps, the arrangement in which the at least one interconnect 126-1, 126-2, 126-3, 126-4 may be formed at (e.g. disposed over) the at least one interconnect 106-1, 106-2, 106-3, 106-4 may be referred to as a bump-to-bump arrangement. A dimension of the at least one interconnect 126-1, 126-2, 126-3, 126-4 may, for example, be substantially equal to a dimension (e.g. the height H and/or width W) of the at least one interconnect 106-1, 106-2, 106-3, 106-4.

Each interconnect 126-x of the at least one interconnect 126-1, 126-2, 126-3, 126-4 may be coupled to a respective contact 104c-x of the at least one contact 104c-1, 104c-2, 104c-3, 104c-4 of the memory chip 104.

The memory chip 104 may include at least one through-via 142-1, 142-2, 142-3, 142-4. Four through-vias 142-1, 142-2, 142-3, and 142-4 are shown as an example, however the number of through-vias may be less than four or may be greater than four, and may, for example, be five, six, seven eight, nine, tens, hundreds, or thousands of through-vias. The number of through-vias 142-x may be equal to the number of contacts 104c-x of the memory chip 104. Each through-via 142-x may be coupled to a respective contact 104c-x of the memory chip 104.

In an example where the memory chip 104 may include, or may consist of, silicon, the at least one through-via 142-1, 142-2, 142-3, 142-4 may, for example, be referred to as a through-silicon via (TSV).

The at least one through-via 142-1, 142-2, 142-3, 142-4 of the memory chip 104 may, for example, have a pitch in the range from about 20 μm to about 60 μm, for example in the range from about 30 μm to about 50 μm, for example about 40 μm.

The memory chip 104 may include at least one contact 124c-1, 124c-2, 124c-3, 124c-4 formed at (e.g. disposed at or over) the second side 104b of the memory chip 104. Four contacts 124c-1, 124c-2, 124c-3, and 124c-4 are shown as an example, however the number of contacts 124c-x may be less than four, or may be greater than four, and may, for example, be five, six, seven eight, nine, tens, hundreds, or thousands of contacts formed at (e.g. disposed at or over) the second side 104b of the memory chip 104. The number of contacts 124c-x may be the same as the number of through-vias 142-x. Each contact 124c-x may be coupled to a respective through-via 142-x of the memory chip 104.

The second memory chip 114 may include at least one contact 114c-1, 114c-2, 114c-3, 114c-4 formed at (e.g. disposed at or over) a side 114a of the second memory chip 114 facing the second side 104b of the memory chip 104. Four contacts 114c-1, 114c-2, 114c-3, and 114c-4 are shown as an example, however the number of contacts 114c may be less than four, or may be greater than four, and may, for example, be five, six, seven eight, nine, tens, hundreds, or thousands of contacts formed at (e.g. disposed at or over) the side 114a of the second memory chip 104. The number of contacts 114c of the second memory chip 114 may be the same as the number of contacts 124c-x of the memory chip 104.

At least one interconnect 136-1, 136-2, 136-3, 136-4 may be disposed between the at least one contact 124c-x of the memory chip 104 and the at least one contact 114c of the second memory chip 114. The number of interconnects 136-x may be the same as the number of contacts 124c-x of the memory chip 104 and the number of contacts 114c of the second memory chip 114.

The at least one through-via 142-1, 142-2, 142-3, 142-4 of the memory chip 104 may, for example, couple (e.g. electrically couple) the second memory chip 114 to the logic chip 102. For example, as shown in FIG. 1D, the second memory chip 114 and the logic chip 102 may be coupled (e.g. electrically coupled) to each other via the at least one through-via 142-1, 142-2, 142-3, 142-4 and the at least one interconnect 136-1, 136-2, 136-3, 136-4 disposed between the memory chip 104 and the second memory chip 114.

The at least one interconnect 136-1, 136-2, 136-3, 136-4 may include, or may be, a bump, for example, a solder bump, a micro-bump (e.g. micro-solder bump), a flip-chip bump (e.g. a micro flip-chip bump) or a pillar bump (e.g. a micro-pillar bump).

In an example where the at least one interconnect 136-1, 136-2, 136-3, 136-4 may be a bump, and the at least one through-via 142-1, 142-2, 142-3, 142-4 may be a TSV, the arrangement in which the at least one interconnect 136-1, 136-2, 136-3, 136-4 may be formed at (e.g. disposed over) the at least one through-via 142-1, 142-2, 142-3, 142-4 may be referred to as a bump-to-TSV arrangement. A dimension of the at least one interconnect 136-1, 136-2, 136-3, 136-4 may, for example, be substantially equal to a dimension (e.g. the height H and/or width W) of the at least one interconnect 106-1, 106-2, 106-3, 106-4.

The second memory chip 114 may include any one of, or any combination of, a volatile memory chip (e.g. a random access memory (RAM) chip, such as a dynamic random access memory (DRAM) chip, a static random access memory (SRAM) chip, etc.) and a non-volatile memory chip (e.g. a read only memory (ROM) chip, such as an erasable programmable read only memory (EPROM) chip, an electronically erasable programmable read only memory (EEPROM) chip, etc.), although other types of memory chips may be possible as well.

As shown in the chip arrangement of FIG. 1D, the memory chip 104 (e.g. wide I/O DRAM) may be arranged above the logic chip 102. Furthermore, the second memory chip 114 (e.g. wide I/O DRAM) may be stacked above the memory chip 104 (e.g. wide I/O DRAM). Accordingly, a process flow that may manufacture the chip arrangement 105 may additionally require the second memory chip 114 (wide I/O DRAM) to be picked and placed, for example, on top of the memory chip 104 (e.g. wide I/O DRAM). In another example, the converse may be true, namely, the memory chip 104 (e.g. wide I/O DRAM) may need to be picked and placed, for example, on top of the second memory chip 114 (e.g. wide I/O DRAM).

In the chip arrangement 100 and/or the chip arrangement 105, a large number of interconnects (e.g. interconnects 106-x and/or interconnects 126-x and/or interconnects 136-x) may need to be connected to, for example, other interconnects (e.g. interconnects 106-x and/or interconnects 126-x and/or interconnects 136-x) and/or contacts (e.g. contacts 102c-x and/or contacts 104c-x) in a process flow step (e.g. a single process flow step). For example, according to the JEDEC wide I/O interface standard, 1200 I/Os may need to be connected to interconnects (e.g. interconnects 106-x and/or interconnects 126-x and/or interconnects 136-x) and/or contacts (e.g. contacts 102c-x and/or contacts 104c-x). The connection may be performed by means of, for example, soldering (e.g. reflow soldering).

It may be observed in FIG. 1A and FIG. 1D that forming the connection (e.g. by means of soldering, e.g. reflow soldering) between the logic chip 102 and/or the memory chip 104 and/or the second memory chip 114 may require a uniform height distribution of the interconnects 106-x and/or interconnects 126-x and/or interconnects 136-x. For example, a non-uniform height among the interconnects (e.g. 106-x and/or 126-x and/or 136-x) may prevent, or substantially reduce the probability of, forming a reliable coupling (e.g. electrical coupling) between the logic chip 102 and the memory chip 104 and/or between the memory chip 104 and the second memory chip 114 and/or between the logic chip 102 and the second memory chip 114.

It may be observed in FIG. 1A and FIG. 1D that forming the connection (e.g. by means of soldering, e.g. reflow soldering) between the logic chip 102 and/or the memory chip 104 and/or the second memory chip 114 may require the availability of all interconnects (e.g. 106-x and/or 126-x and/or 136-x) in order to form a reliable interconnect between the logic chip 102 and/or the memory chip 104 and/or the second memory chip 114. For example, if one or more interconnects (e.g. 106-x and/or 126-x and/or 136-x) are missing, the formation of a reliable coupling (e.g. electrical coupling) between the logic chip 102 and the memory chip 104 and/or between the memory chip 104 and the second memory chip 114 and/or between the logic chip 102 and the second memory chip 114 may be prevented or its probability substantially reduced.

It may be observed in FIG. 1A and FIG. 1D that forming the connection (e.g. by means of soldering, e.g. reflow soldering) between the logic chip 102 and the memory chip 104 and/or between the memory chip 104 and the second memory chip 114 may require an accurate placement of interconnects (e.g. 106-x and/or 126-x and/or 136-x) on other interconnects (e.g. 106-x and/or 126-x and/or 136-x) and/or on contacts (e.g. 102c-x and/or 104c-x). For example, if wettability (e.g flux) is missing on contacts (e.g. 102c-x and/or 104c-x), the formation of a reliable coupling (e.g. electrical coupling) between the logic chip 102 and/or the memory chip 104 and/or the second memory chip 114 may be prevented or its probability substantially reduced.

It may be observed in FIG. 1A and FIG. 1D that forming the connection (e.g. by means of soldering, e.g. reflow soldering) between the logic chip 102 and the memory chip 104 and/or between the memory chip 104 and the second memory chip 114 may require an accurate alignment of the logic chip 102 and/or the memory chip 104 and/or the second memory chip 114. For example, a misalignment of the logic chip 102 and/or the memory chip 104 and/or the second memory chip 114 may prevent, or substantially reduce the probability of, forming a reliable coupling (e.g. electrical coupling) between the logic chip 102 and the memory chip 104 and/or between the memory chip 104 and the second memory chip 114 and/or between the logic chip 102 and the second memory chip 114.

As described above in relation to FIG. 1A and FIG. 1D, the height H and/or the width W of the interconnects (e.g. 106-x and/or 126-x and/or 136-x, such as micro-bumps) may be of the order of tens of microns (e.g. a few microns). Accordingly, the above-identified challenges related to the chip arrangement 100 and/or the chip arrangement 105 are further exacerbated since a tolerance for error at such dimensions may be low.

For example, it may be possible that even if only a single one of the electrical connections between the logic chip 102 and the memory chip 104 (e.g. one of the 1200 connections in a wide I/O memory stack) fails, e.g. due to one or more of the aforementioned errors (e.g. non-uniform height of interconnects, missing interconnect, inaccurate placement of interconnects, inaccurate chip alignment), the whole chip arrangement 100/105 may not function properly. Therefore, an overall yield may critically depend on the generation of defective electrical connections or interconnects in the die stacking process.

For example, test results for a wide I/O DRAM stack have shown that an overall yield obtained with a conventional automated stacking process may be as low as 76%. In other words, nearly one quarter of the fabricated wide I/O DRAM memories would have to be discarded due to the occurrence of one or more of the aforementioned errors during the stacking process.

Further tests have shown that the stacking process yield may, for example, be increased to about 92% by manually aligning the chips of the stack. However, manual alignment may be a time-consuming process flow step that may prohibitively increase the cost of manufacturing. Another method to improve the yield may be to use a high accuracy bonder and/or optical inspection during manufacturing. However, this may also prohibitively increase the cost of manufacturing.

In view of the above-mentioned considerations, the following needs may be identified:

There may be a need to provide a chip arrangement that may provide high yield.

There may be a need to provide a chip arrangement that may provide high yield at a low manufacturing cost.

There may be a need to improve the yield of a chip stacking process, e.g. a logic-memory stacking process, e.g. a wide I/O memory stacking process.

There may be a need to provide a chip arrangement that may provide high yield in spite of a variance in height of interconnects that may be included in the chip arrangement.

There may be a need to provide a chip arrangement that may provide high yield in spite of one or more interconnects missing in the chip arrangement.

There may be a need to provide a chip arrangement that may provide high yield in spite of an inaccurate placement of interconnects on other interconnects and/or on contacts that may be included in the chip arrangement.

There may be a need to provide a chip arrangement that may provide high yield in spite of an inaccurate alignment of chips that may be included in the chip arrangement.

Figure 2:
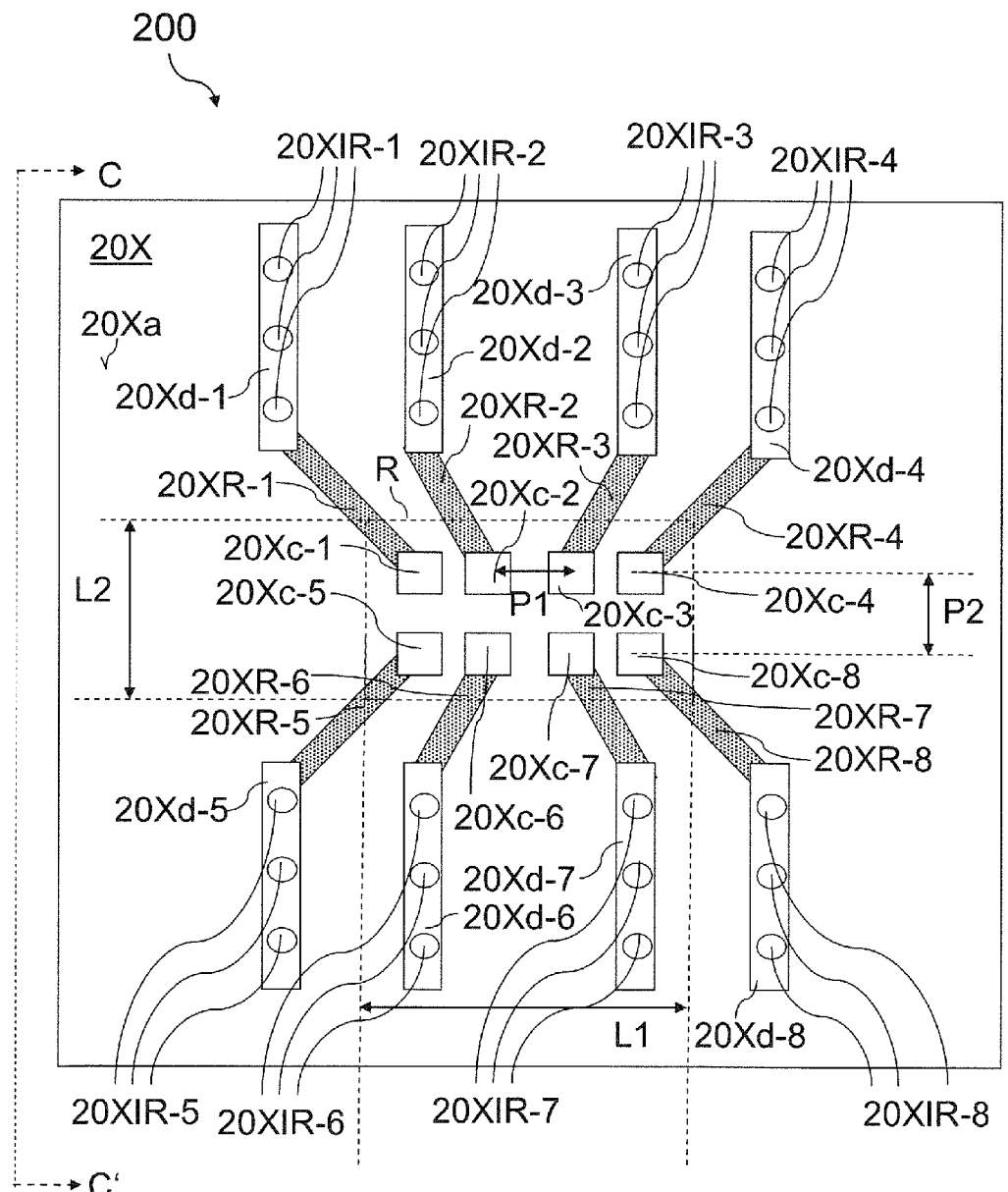
FIG. 2 shows a plan view of a chip that may be used in a chip arrangement.

Such a chip arrangement may, for example, be provided by means of the chip 20X shown in FIG. 2.

FIG. 2 shows a plan view 200 of a chip 20X that may be used in a chip arrangement.

The chip 20X may, for example, be similar to the chip 10X shown in FIG. 1B in some respects, but may differ from the chip 10X in others. Reference signs in FIG. 2 that are the same as in FIG. 1B denote the same or similar elements as in FIG. 1B. Thus, those elements will not be described in detail again here; reference is made to the description above. Differences between FIG. 2 and FIG. 1B are described below.

The chip 20X may have a first side 20Xa. The first side 20Xa of the chip 20X may, for example, be identified with the first side 10Xa of the chip 10X shown in FIG. 1B.

The chip 20X may include at least one first contact 20Xc-1 to 20Xc-8, which may, for example, be formed at (e.g. disposed at or over) the first side 20Xa of the chip 20X. The at least one first contact 20Xc-1 to 20Xc-8 of the chip 20X may, for example, be identified with the at least one contact 10Xc-1 to 10Xc-8 of the chip 10X, respectively.

The chip 20X may include at least one second contact 20Xd-1 to 20Xd-8, which may, for example, be formed at (e.g. disposed at or over) the first side 20Xa of the chip 20X. A second contact of the at least one second contact 20Xd-1 to 20Xd-8 may, for example, be coupled (e.g. electrically coupled) to a first contact of the at least one first contact 20Xc-1 to 20Xc-8 of the chip 20X by means of a redistribution structure 20XR-1 to 20XR-8. For example, a respective second contact may be coupled (e.g. electrically coupled) to a respective first contact by means of a respective redistribution structure. For example, as shown in FIG. 2, the second contact 20Xd-1 may be coupled (e.g. electrically coupled) to the first contact 20Xc-1 by means of the redistribution structure 20XR-1.

A plurality of interconnects may be coupled (e.g. electrically coupled) to a respective second contact of the at least one second contact 20Xd-1 to 20Xd-8 of the chip 20X. For example, as shown in FIG. 2, a first plurality of interconnects 20XIR-1 may be coupled (e.g. electrically coupled) to a first second contact 20Xd-1, a second plurality of interconnects 20XIR-2 may be coupled (e.g. electrically coupled) to a second contact 20Xd-2, a third plurality of interconnects 20XIR-3 may be coupled (e.g. electrically coupled) to a third second contact 20Xd-3, etc. Three interconnects are shown to be coupled (e.g. electrically coupled) to a respective second contact 20Xd-x as an example, however the number of interconnects coupled (e.g. electrically coupled) to a respective second contact 20Xd-x may be two, or may be greater than three, and may, for example, be four, five, six, or more.

Compared to the chip 10X shown in FIG. 1B, the chip 20X shown in FIG. 2 may include a redistribution structure 20XR-1 to 20XR-8, which may, for example, reroute an electrical connection from a respective first contact 20Xc-1 to 20Xc-8 to a respective second contact 20Xd-1 to 20Xd-8. For example, as shown in FIG. 2, the redistribution structure 20XR-1 may reroute an electrical connection from the first contact 20Xc-1 to the second contact 20Xd-1.

Compared to the chip 10X shown in FIG. 1B, the chip 20X shown in FIG. 2 may include a plurality of interconnects 20XIR-1 to 20XIR-8 coupled (e.g. electrically coupled) to a respective second contact 20Xd-1 to 20Xd-8. For example, as shown in FIG. 2, the first plurality of interconnects 20XIR-1 may be coupled (e.g. electrically coupled) to the first second contact 20Xd-1.

The chip 20X shown in FIG. 2 may be coupled (e.g. electrically coupled) to another chip (not shown in FIG. 2, see e.g. FIG. 3) by means of the plurality of interconnects 20XIR-1 to 20XIR-8.

In the conventional arrangement shown in FIG. 1B, including chip 10X, there is only one interconnect 106-x per chip contact 10Xc-x. Thus, for a large number of interconnects, there may be a relatively high probability that the coupling (e.g. an electrical coupling) via at least one of the interconnects 106-x between the chip 10X and another chip may fail for at least one of the following reasons: non-uniform height among the plurality of interconnects 106-x, at least one interconnect missing from the plurality of interconnects 106-x, missing wettability (e.g flux) on the at least one contact 10Xc-x, contamination (e.g. due to contaminants disposed at or over the interconnect 106-x and/or the at least one contact 10Xc-x), and misalignment of the chip 10X and the other chip. Thus, the yield may be relatively low as described above.

In the chip arrangement including chip 20X, though, a plurality of interconnects (illustratively including one or more backup interconnects) may be provided for each chip contact, that is for each first contact 20Xc-x of chip 20X. For example, first contact 20Xc-1 is coupled to first second contact 20Xd-1 via redistribution structure 20XR-1, and the first plurality of interconnects 20XIR1-1 (including three interconnects in this example) is provided to couple the first second contact 20Xd-1 (and thus the first contact 20Xc-1) to the other chip. The probability that at least one of the interconnects of the first plurality of interconnects 20Xd-1 actually couples the first second contact 20Xd-1 (and thus the first contact 20Xc-1) to a respective counterpart contact of the other chip may be considerably higher than in the case of only one interconnect, as shown in FIG. 1B. Similar considerations may apply for the other contacts 20Xc-2, 20Xc-3, . . . , 20Xc-8 of chip 20X, which may also be provided with one or more backup interconnects, as shown (in FIG. 2, all of the contacts 20Xc-x are provided with three interconnects; however it may also be possible that only some of the contacts 20Xc-x are provided with backup interconnects, or that the number of backup interconnects may be different for the various contacts 20Xc-1, 20Xc-2, . . . , 20Xc-8). Thus, the probability that all chip contacts (i.e. contacts 20Xc-1, . . . , 20Xc-8 in the example shown) of chip 20X will be electrically coupled to their respective counterpart on the other chip may be significantly increased, and thus the yield in a chip stacking process may be increased.

An effect provided by the chip 20X shown in FIG. 2 may be a provision of at least one backup electrical connection between a contact of the chip 20X and a respective counterpart contact of the other chip that may be coupled (e.g. electrically coupled) to the chip 20X, e.g. by means of the plurality of interconnects 20XIR-1 to 20XIR-8. Thus, one or more electrical connections between the chip 20X and the other chip may illustratively be doubled, or tripled, or multiplied by some other factor, thus increasing the probability of a proper electrical coupling between the chips. For example, even if one interconnect of the first plurality of interconnects 20XIR-1 may fail to couple (e.g. electrically couple) the first contact 20Xc-1 of chip 20X to a respective counterpart contact of the other chip due to any one of, or any combination of, the above-identified reasons (or for other reasons), there may be at least one other interconnect of the first plurality of interconnects 20XIR-1 that may provide the intended coupling (e.g. electrical coupling). Similar considerations may hold for the other first contacts 20Xc-2, . . . , 20Xc-8 shown in FIG. 2. Illustratively, a signal on a respective first contact 20Xc-x of the chip 20X may be exchanged between the chip 20X and the other chip via two or more signal paths (e.g. via the respective plurality of interconnects 20XIR-x coupled to the respective first contact 20Xc-x via the corresponding second contact 20Xd-1 and redistribution structure 20XR-x). Therefore, this may increase a probability of having at least one connection (e.g. electrical connection) between a respective first contact 20Xc-x of the chip 20X and a respective counterpart contact of another chip the chip 20X may be coupled (e.g. electrically coupled) to.

Accordingly, an effect provided by the chip 20X may be high yield in spite of an inaccurate alignment of the chip 20X and another chip.

An effect provided by the chip 20X may be high yield for a chip arrangement including the chip 20X.

An effect provided by the chip 20X may be high yield at a low manufacturing cost for a chip arrangement including the chip 20X.

An effect provided by the chip 20X may be high yield in spite of a variance in height of interconnects for a chip arrangement including the chip 20X.

An effect provided by the chip 20X may be high yield in spite of one or more interconnects missing in a chip arrangement including the chip 20X.

An effect provided by the chip 20X may be high yield in spite of an inaccurate placement of interconnects on other interconnects and/or on contacts that may be included in a chip arrangement including the chip 20X.

An effect provided by the chip 20X may be that yield of a chip stacking process, e.g. a logic-memory stacking process, e.g. a wide I/O memory stacking process, may be improved.

Figure 3:
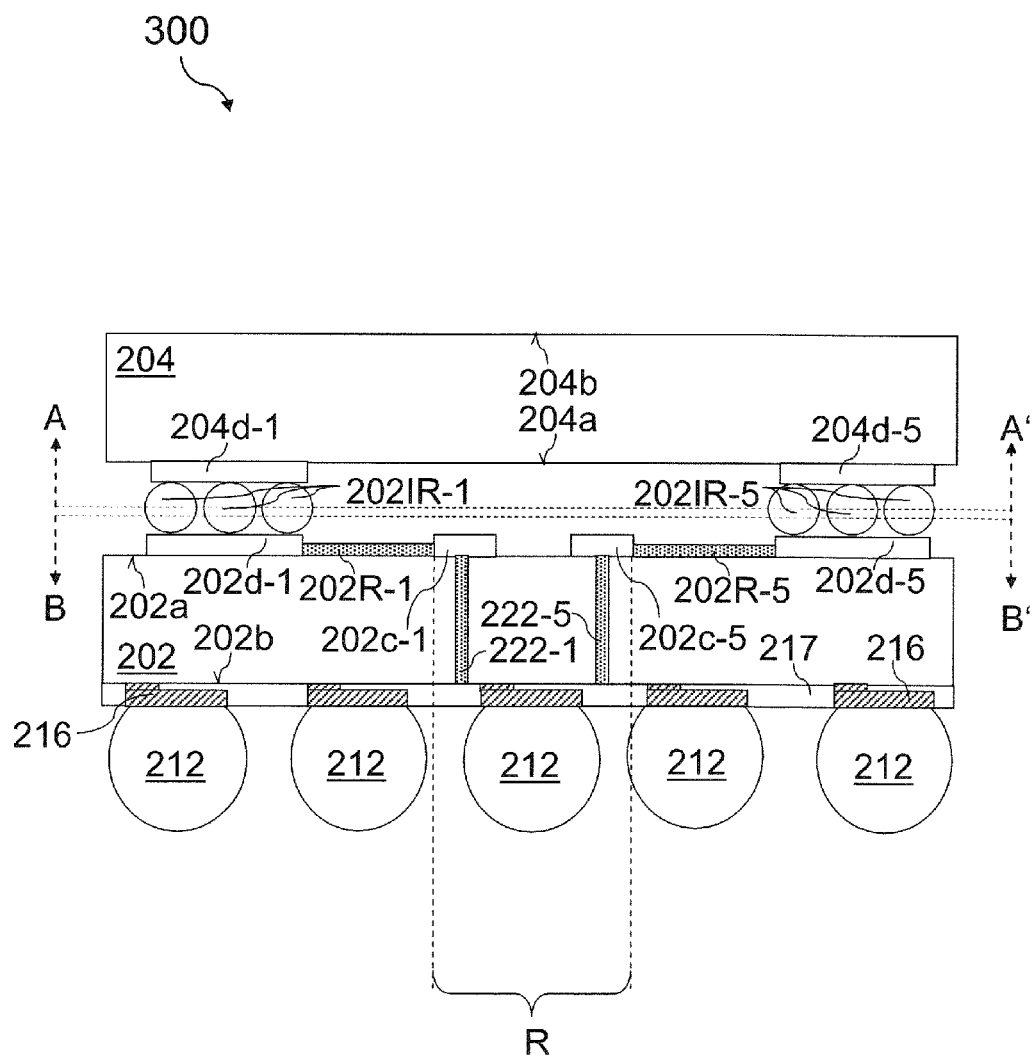
FIG. 3 shows a chip arrangement that may include a first chip and a second chip.

FIG. 3 shows a chip arrangement 300 that may include a first chip 202 and a second chip 204.

In the chip arrangement 300 shown in FIG. 3, the first chip 202 may, for example, be identified with the chip 20X shown in FIG. 2. In particular, the view 200 shown in FIG. 2 may a view of the chip arrangement 300 along the line B-B' shown in FIG. 3. By way of another example, the first chip 202 shown in FIG. 3 may be a view of the chip 20X shown in FIG. 2 along the line C-C' shown in FIG. 2. Accordingly, the various effects described above in relation to the chip 20X shown in FIG. 2 may be analogously valid for the chip arrangement 300 shown in FIG. 3.

The first chip 202 may have a first side 202a and a second side 202b opposite the first side 202a. The first side 202a and the second side 202b of the first chip 202 may include, or may be, a backside and a frontside of the first chip 202, respectively. By way of another example, the first side 202a and the second side 202b of the first chip 202 may include, or may be, a top surface and a bottom surface of the first chip 202, respectively. The first chip 202 may be arranged as in a typical flip chip arrangement with the frontside 202b facing down (facing away from an interface between the first chip 202 and the second chip 204), e.g. towards a ball grid array as shown in FIG. 3.

The first chip 202 may include a semiconductor substrate, which may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well.

The first chip 202 may include, or may be, a logic chip. In other words, the first chip 202 may include, or may be, a chip (or die) for logic applications. For example, the first chip 202 may include, or may be, a processor, such as, for example, a central processing unit (CPU), a GPU (graphics processing unit), an AP (application processor), a base band modem, a micro controller, or the like.

The first chip 202 may include at least one first contact 202c-1, 202c-5. For example, the first contact 202c-1 and the first contact 202c-5 of the first chip 202 may be identified with the first contact 20Xc-1 and the first contact 20Xc-5 of the chip 20X shown in FIG. 2, respectively.

The first chip 202 may include at least one second contact 202d-1, 202d-5. For example, the second contact 202d-1 and the second contact 202d-5 of the first chip 202 may be identified with the second contact 20Xd-1 and the second contact 20Xd-5 of the chip 20X shown in FIG. 2, respectively.

The at least one first contact 202c-1, 202c-5 and/or the at least one second contact 202d-1, 202d-5 may include, or may consist of, at least one electrically conductive material selected from a group of electrically conductive materials. The group of electrically conductive materials may consist of: a metal or a metal alloy, although other electrically conductive materials may be possible as well. For example, the at least one first contact 202c-1, 202c-5 and/or the at least one second contact 202d-1, 202d-5 may include, or may consist of, copper, nickel, gold, palladium, titanium, chrome, tungsten or aluminum or a metal alloy or metal stack including one or more of the above mentioned materials.

The first chip 202 may include at least one redistribution structure 202R-1, 202R-5. For example, the redistribution structure 202R-1 and the redistribution structure 202R-5 of the first chip 202 may be identified with the redistribution structure 20XR-1 and the redistribution structure 20XR-1 of the chip 20X shown in FIG. 2, respectively.

The at least one redistribution structure 202R-1, 202R-5 may couple (e.g. electrically couple) the at least one first contact 202c-1, 202c-5 to the at least one second contact 202d-1, 202d-5 of the first chip 202. For example, the at least one redistribution structure 202R-1, 202R-5 may redistribute and/or re-map electrical connections from the at least one first contact 202c-1, 202c-5 of the first chip 202 to the at least one second contact 202d-1, 202d-5 of the first chip 202, or vice versa.

The at least one redistribution structure 202R-1, 202R-5 may include a redistribution layer (RDL) that may, for example, be disposed at the first side 202a of the first chip 202. The at least one redistribution structure 202R-1, 202R-5 (e.g. RDL) may, for example, include, or may be, a single-level (e.g. a single layer) RDL. For example, the at least one redistribution structure 202R-1, 202R-5 may include, or may be, a single-level RDL that may include a single metal layer disposed between two or more dielectric layers. The at least one redistribution structure 202R-1, 202R-5 (e.g. RDL) may, for example, include, or may be, a multi-level (e.g. a multi-layer) RDL. For example, the at least one redistribution structure 202R-1, 202R-5 may include, or may be, a multi-level RDL that may include multiple metal layers and dielectric layers, e.g. at least two metal layers disposed within an insulating layer that may include, or may consist of, three or more dielectric layers.

The at least one redistribution structure 202R-1, 202R-5 disposed at the first side 202a (e.g. frontside) of the first chip 202 may include, or may be, a front-end metallization layer of the first chip 202, and may for example be realized in one or more of the last chip metals (e.g. Metal-N and/or Metal-(N−1) and/or Metal-(N−2), etc.). Alternatively, the at least one redistribution structure 202R-1, 202R-5 may be realized as a redistribution layer that is formed after completion of front-end metal and passivation layers.

The at least one redistribution structure 202R-1, 202R-5 may include, or may consist of, at least one electrically conductive material selected from a group of electrically conductive materials. The group of electrically conductive materials may consist of: a metal or a metal alloy, although other electrically conductive materials may be possible as well. For example, the at least one redistribution structure 202R-1, 202R-5 may include, or may consist of, copper, nickel, gold, palladium, titanium, chrome, tungsten or aluminum or a metal alloy or metal stack including one or more of the above mentioned materials.

The first chip 202 may include at least one through-via 222-1, 222-5. In an example where the first chip 202 may include, or may consist of, silicon, the at least one through-via 222-1, 222-5 may, for example, include, or may be, a thru-silicon via (TSV).

The at least one through-via 222-1, 222-5 of the first chip 202 may extend from the second side 202b to the first side 202a of the first chip 202, or vice versa. The at least one through-via 222-1, 222-5 of the first chip 202 may be coupled (e.g. electrically coupled) to the at least one first contact 202c-1, 202c-5 formed at (e.g. disposed at or over) the first side 202a of the first chip 202. For example, a respective through-via may be coupled (e.g. electrically coupled) to a respective first contact. For example, the through-via 222-1 and the through-via 222-5 may be coupled (e.g. electrically coupled) to the first contact 202c-1 and the first contact 202c-5 of the first chip 202, respectively.

The at least one through-via 222-1, 222-5 may be disposed under the at least one first contact 202c-1, 202c-5. For example, the through-via 222-1 and the through-via 222-5 may be disposed under the first contact 202c-1 and the first contact 202c-5 of the first chip 202, respectively. The at least one through-via 222-1, 222-5 (e.g. disposed under the at least one first contact 202c-1, 202c-5) may be in contact (e.g. in physical contact with, for example, in direct physical contact with) with the at least one first contact 202c-1, 202c-5 of the first chip 202, as shown in FIG. 3.

The at least one through-via 222-1, 222-5 may, for example, include, or may consist of, at least one electrically conductive material selected from a group of electrically conductive materials. The group of electrically conductive materials may include, or may consist of, a metal or metal alloy. For example, the group may consist of: aluminum, copper, tungsten, titanium, nickel, gold, conductive paste (e.g. a polymer filled with conductive particles) and doped silicon, although other electrically conductive materials may be possible as well.

The chip arrangement 300 may include a second chip 204.

The second chip 204 may include, or may be, a memory chip. For example, the second chip 204 may include, or may be, a random access memory (RAM) chip, such as, for example, a dynamic RAM (DRAM) chip, although other memory chips may be possible as well.

The second chip 204 may have a first side 204a and a second side 204b opposite the first side 204a. The first side 204a and the second side 204b of the second chip 204 may include, or may be, a frontside and a backside of the second chip 204, respectively. By way of another example, the first side 204a and the second side 204b of the second chip 204 may include, or may be, a bottom surface and a top surface of the second chip 204, respectively.

The second chip 204 may include a semiconductor substrate, which may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well.

The second chip 204 may include at least one contact 204d-1, 204d-5, which may be formed at the first side 204a of the second chip 204, as shown in FIG. 3. The at least one contact 204d-1, 204d-5 may include, or may consist of, at least one electrically conductive material selected from a group of electrically conductive materials. The group of electrically conductive materials may consist of: a metal or a metal alloy, although other electrically conductive materials may be possible as well. For example, the at least one contact 204d-1, 204d-5 may include, or may consist of, copper, nickel, gold, palladium, titanium, chrome, tungsten or aluminum or a metal alloy or metal stack including one or more of the above mentioned materials.

The chip arrangement 300 may include a plurality of interconnects 202IR-1, 202IR-5.

The plurality of interconnects 202IR-1, 202IR-5 may include, or may consist of, at least one electrically conductive material selected from a group of electrically conductive materials. The group may consist of: a metal or metal alloy. For example, the plurality of interconnects 202IR-1, 202IR-5 may consist of a solder material (e.g. an alloy of tin, silver, and copper). By way of another example, the plurality of interconnects 202IR-1, 202IR-5 may consist of copper or a copper alloy.

The plurality of interconnects 202IR-1, 202IR-5 may include, or may be, a plurality of bumps, for example, solder bumps and/or micro-bumps (e.g. micro-solder bumps) and/or flip-chip bumps (e.g. a micro flip-chip bumps) and/or pillar bumps (e.g. micro-pillar bumps).

The plurality of interconnects 202IR-1, 202IR-5 may have a height H, which may, for example, refer to the widest extent of the plurality of interconnects 202IR-1, 202IR-5 measured in a direction perpendicular to the first side 202a of the first chip 202 and/or a direction perpendicular to the first side 204a of the second chip 204. The height H of the plurality of interconnects 202IR-1, 202IR-5 may be similar or the same as the height H of the interconnects 106-x shown in FIG. 1A.

The plurality of interconnects 202IR-1, 202IR-5 may have a width W, which may, for example, refer to the widest extent of the plurality of interconnects 202IR-1, 202IR-5 measured in a direction perpendicular to the height H. The width W of the plurality of interconnects 202IR-1, 202IR-5 may be similar or the same as the width W of the interconnects 106-x shown in FIG. 1A.

The first chip 202 may be coupled (e.g. electrically coupled) to the second chip 204, e.g. via the plurality of interconnects 202IR-1, 202IR-5. The second chip 204 may be coupled (e.g. electrically coupled) to the first chip 202, e.g. via the plurality of interconnects 202IR-1, 202IR-5. In other words, the first chip 202 and the second chip 204 may be coupled to each other via the plurality of interconnects 202IR-1, 202IR-5.

At least one interconnect of the plurality of interconnects 202IR-1, 202IR-5 disposed between the first chip 202 and the second chip 204 may, for example, couple (e.g. electrically couple) the first chip 202 and the second chip 204 to each other.

The plurality of interconnects 202IR-1, 202IR-5 may be formed at (e.g. disposed at or over) the at least one second contact 202d-1, 202d-5 of the first chip 202. In such an example, the plurality of interconnects 202IR-1, 202IR-5 may be coupled (e.g. electrically coupled) to the at least one second contact 202d-1, 202d-5 of the first chip 202. For example, the plurality of interconnects 202IR-1 and the plurality of interconnects 202IR-5 may be coupled (e.g. electrically coupled) to the second contact 202d-1 and the second contact 202d-5 of the first chip 202, respectively. One or more of the plurality of interconnects 202IR-1, 202IR-5 coupled (e.g. electrically coupled) to the at least one second contact 202d-1, 202d-5 of the first chip 202 may be coupled (e.g. electrically coupled) to the at least one contact 204d-1, 204d-5 of the second chip 204. In such an example, one or more of the plurality of interconnects 202IR-1, 202IR-5 may couple the at least one second contact 202d-1, 202d-5 of the first chip 202 to the at least one contact 204d-1, 204d-5 of the second chip 204. For example, at least one interconnect of the plurality of interconnects 202IR-1 may couple the second contact 202d-1 of the first chip 202 to the contact 204d-1 of the second chip 204. Similarly, at least one interconnect of the plurality of interconnects 202IR-5 may couple the second contact 202d-5 of the first chip 202 to the contact 204d-5 of the second chip 204. In other words, there may be an electrical connection between the second contact 202d-1 of the first chip 202 and the contact 204d-1 of the second chip 204 via at least one of the interconnects of the plurality of interconnects 202IR-1. Similarly, there may be an electrical connection between the second contact 202d-5 of the first chip 202 and the contact 204d-5 of the second chip 204 via at least one of the interconnects of the plurality of interconnects 202IR-5. Similar considerations may apply for other second contacts of the first chip 202 and respective counterpart contacts of the second chip 204.

The plurality of interconnects 202IR-1, 202IR-5 may be formed at (e.g. disposed at or over) the at least one contact 204d-1, 204d-5 of the second chip 204. In such an example, the plurality of interconnects 202IR-1, 202IR-5 may be coupled (e.g. electrically coupled) to the at least one contact 204d-1, 204d-5 of the second chip 202. For example, the plurality of interconnects 202IR-1 and the plurality of interconnects 202IR-5 may be coupled (e.g. electrically coupled) to the contact 204d-1 and the contact 204d-5 of the second chip 204, respectively. One or more of the plurality of interconnects 202IR-1, 202IR-5 coupled (e.g. electrically coupled) to the at least one contact 204d-1, 204d-5 of the second chip 204 may be coupled (e.g. electrically coupled) to the at least one second contact 202d-1, 202d-5 of the first chip 202. In such an example, one or more of the plurality of interconnects 202IR-1, 202IR-5 may couple the at least one contact 204d-1, 204d-5 of the second chip 204 to the at least one second contact 202d-1, 202d-5 of the first chip 202. For example, at least one interconnect of the plurality of interconnects 202IR-1 may couple the contact 204d-1 of the second chip 204 to the second contact 202d-1 of the first chip 202. Similarly, at least one interconnect of the plurality of interconnects 202IR-5 may couple the contact 204d-5 of the second chip 204 to the second contact 202d-5 of the first chip 202. In other words, there may be an electrical connection between the contact 204d-1 of the second chip 204 and the second contact 202d-1 of the first chip 202 via at least one of the interconnects of the plurality of interconnects 202IR-1. Similarly, there may be an electrical connection between the contact 204d-5 of the second chip 204 and the second contact 202d-5 of the first chip 202 via at least one of the interconnects of the plurality of interconnects 202IR-5. Similar considerations may apply for other contacts of the second chip 204 and respective counterpart second contacts of the first chip 202.

The chip arrangement 300 may include a plurality of solder balls 212. The first chip 202 (e.g. logic chip) may be electrically connected to at least one solder ball of the plurality of solder balls 212 by means of a redistribution layer (RDL) 216 (e.g. frontside RDL). The RDL 216 may, for example, be partially or fully disposed within an insulating layer 217 (e.g. a dielectric layer). The RDL 216 may redistribute and/or re-map electrical connections from the first chip 202 to the plurality of solder balls 212.

As described above in relation to FIG. 1A, an I/O (which may, for example, refer to a pathway for a signal to travel between the second chip 204 and the first chip 202) may at least be provided by, for example, the at least one through-via 222-1, 222-5, which may be coupled (e.g. electrically coupled) to the at least one first contact 202c-1, 202c-5, as shown in FIG. 3.

As shown in FIG. 3, the at least one first contact 202c-1, 202c-5, the at least one redistribution structure 202R-1, 202R-5, and the at least one second contact 202d-1, 202d-5 of the first chip 202 may, for example, form at least one conductive path (e.g. an electrically conductive path). Accordingly, at least one I/O may be rerouted from the region R that may be located at or near a center of the first chip 202 to another area (e.g. peripheral area or edge area) of the first chip 202 (e.g. by means of the at least one redistribution structure 202R-1, 202R-5).

As shown in FIG. 3, the plurality of interconnects 202IR-1, 202IR-5 may be coupled (e.g. electrically coupled) to the at least one second contact 202d-1, 202d-5 of the first chip 202 and the at least one contact 204d-1, 204d-5 of the second chip 204.

Accordingly, there may be more than one signal path for a respective through-via 222-1, 222-5. For example, there may be three signal paths (e.g. provided via each interconnect of the plurality of interconnects 202IR-1) for the through-via 222-1. Accordingly, the plurality of interconnects 202IR-1, 202IR-5 may provide at least one backup electrical connection between the first chip 202 and the second chip 204 that may be coupled (e.g. electrically coupled) to the first chip 202. For example, even if one interconnect of the plurality of interconnects 202IR-1, 202IR-5 may fail to couple (e.g. electrically couple) the first chip 202 to the second chip 204, there may be at least one other interconnect that may provide the intended coupling (e.g. electrical coupling). For example, even if one interconnect of the plurality of interconnects 202IR-1 may fail to form a coupling (e.g. electrical coupling) between the second contact 202d-1 of the first chip 202 and the contact 204d-1 of the second chip 204, there may be at least one other interconnect of the plurality of interconnects 202IR-1 that may provide the intended coupling, thus ensuring at least one signal path between the second contact 202d-1 of the first chip 202 and the contact 204d-1 of the second chip 204. Similar considerations may apply for the second contact 202d-5 of the first chip 202 and the corresponding counterpart contact 204d-5 of the second chip 204, and/or other pairs of corresponding contacts of the first and second chips 202, 204.

In the example shown in FIG. 3, each interconnect of the plurality of interconnects 202IR-1, 202IR-5 may be arranged at the at least one second contact 202d-1, 202d-5, which may, for example be arranged near an edge of the first chip 202. However, in another example, the plurality of interconnects 202IR-1, 202IR-5 may be distributed between the at least one first contact 202c-1, 202c-5 and the at least one second contact 202d-1, 202d-5 of the first chip 202.

Figure 4:
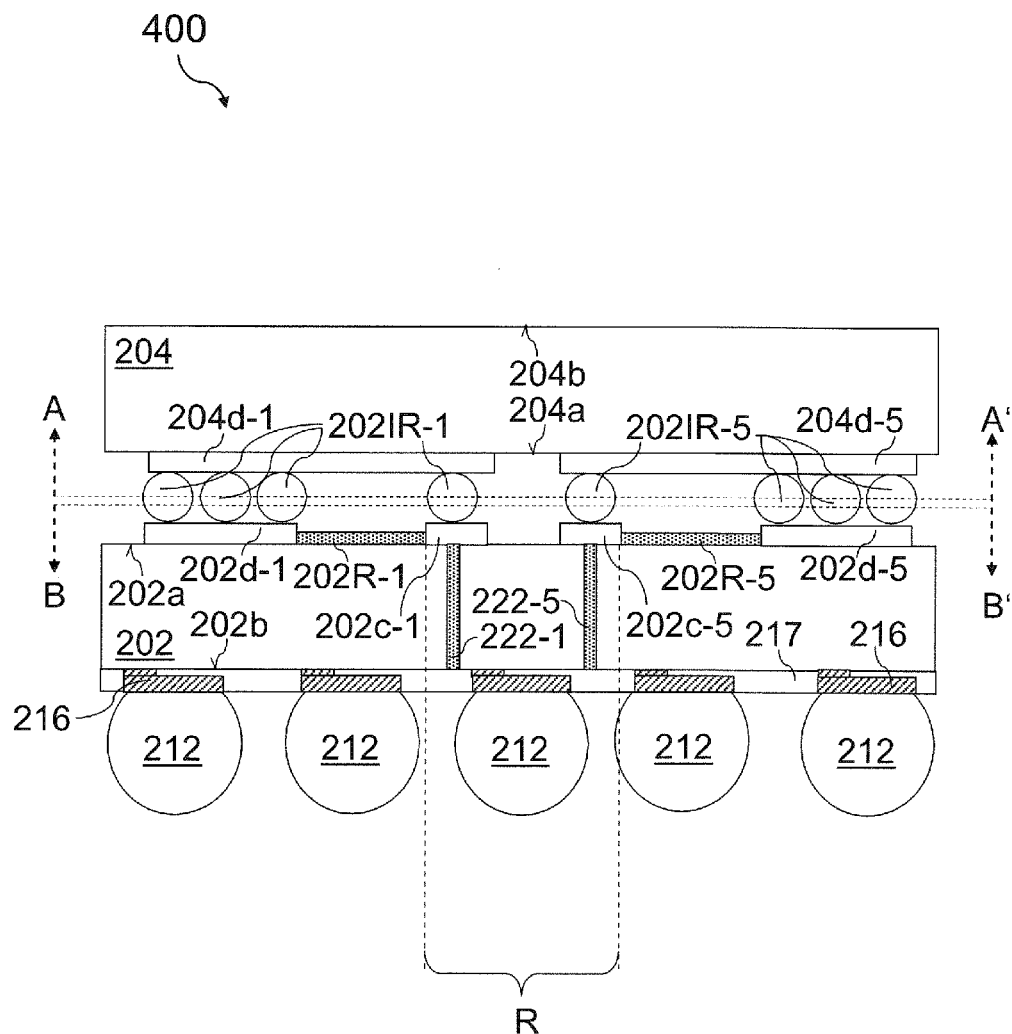
FIG. 4 shows a chip arrangement including a first chip and a second chip, where a plurality of interconnects are distributed between a first contact and a second contact of the first chip.

FIG. 4 shows a chip arrangement 400 including the first chip 202 and the second chip 204, wherein the plurality of interconnects 202IR-1, 202IR-5 may be distributed between the at least one first contact 202c-1, 202c-5 and the at least one second contact 202d-1, 202d-5 of the first chip 202.

Reference signs in FIG. 4 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 400 shown in FIG. 4. Differences between FIG. 4 and FIG. 3 are described below.

As shown in FIG. 4, at least one interconnect of the plurality of interconnects 202IR-1, 202IR-5 may be formed at (e.g. disposed at or over) the at least one first contact 202c-1, 202c-5 of the first chip 202, and at least one other interconnect of the plurality of interconnects 202IR-1, 202IR-5 may be formed at (e.g. disposed at or over) the at least one second contact 202d-1, 202d-5 of the first chip 202.

In such an example, the at least one contact 204d-1, 204d-5 of the second chip 204 may have a lateral extent that may be wide enough such that the at least one interconnect formed at (e.g. disposed at or over) the at least one first contact 202c-1, 202c-5 of the first chip 202 may be in contact (e.g. in physical contact, e.g. direct physical contact) with the at least one contact 204d-1, 204d-5 of the second chip 204. This may, for example, couple (e.g. electrically couple) the at least one interconnect formed at (e.g. disposed at or over) the at least one first contact 202c-1, 202c-5 of the first chip 202 to the at least one contact 204d-1, 204d-5 of the second chip 204, or vice versa.

As described above, the at least one through-via 222-1, 222-5 may be arranged at the region R that may be located at or near a center of the first chip 202. Accordingly, an interconnect coupled to the at least one first contact 202c-1, 202c-5 may minimize a distance of a signal path between the first chip 202 and the second chip 204 for a given I/O.

In an example where the first side 202a of the first chip 202 may be large, all signal paths may be rerouted (e.g. from the at least one through-via 222-1, 222-5, e.g. by means of the at least one redistribution structure 202R-1, 202R-5), for example, on the first side 202a of the first chip 202.

In an example where the first side 202a of the first chip 202 may not be large enough to accommodate the rerouting of all signal paths, the first chip 202 and/or the second chip 204 may be at least partially surrounded by an extension layer laterally extending from one or more sides of the chip, e.g. may be included in an embedded wafer level ball grid array (eWLB) package, which may, for example provide large enough real estate for the rerouting of all signal paths.

In an example, not all signal paths may be required to be rerouted. For example, supply of power supply signals (e.g. ground, VDD, VSS, or the like) to the chip may be realized by many electrical connections anyway, and thus, one or more of these connections may not need to be backed up. For example, a path out of a plurality of paths all providing the same power supply potential (e.g. ground potential) may not need to be rerouted and/or may not need to be provided with backup paths, e.g. via the plurality of interconnects 202IR-1, 202IR-5. For example, FIG. 9 shows a table 900 illustrating input/output (I/O) connections of a wide I/O logic-memory interface according to the JEDEC standard. As may be seen, each block may have 300 I/Os, wherein some of the I/Os may carry the same signal. For example, "VDD1" may be provided by 6 I/Os, "VDD2" may be provided by 20 I/Os, "VDDQ" may be provided by 16 I/Os, etc. Also, some of the I/Os may not be used or connected, as indicated in the table ("NC"). Accordingly, one or more of those signals (indicated by circles in the table) may not need to be rerouted and/or may not need to be provided with backup signal paths, e.g. via the plurality of interconnects 202IR-1, 202IR-5.

Whilst the provision of more than one signal path for a respective through-via 222-1, 222-5 may increase the yield of the chip arrangement 300 and/or the chip arrangement 400 upon chip stacking, the electrical performance of the chip arrangement (e.g. stacked wide I/O DRAM) may be reduced if multiple interconnects (per contact) are realized between the first chip 202 (e.g. logic chip) and the second chip 204 (e.g. memory chip) at the same time. Therefore, it may be desirable to reduce the number of functioning signal paths again (for example, to exactly one signal path per through-via 222-x) after the stacking process in order to avoid having one signal being exchanged between the first chip 202 and the second chip 204 by two or more signal paths possibly having different signal transmission characteristics. The reduction of signal paths may, for example, be achieved by blowing one or more fuses (e.g. e-fuses or laser fuses) that may be provided in the signal paths. In other words, fusing may be applied to select between an electrical connection and its backup electrical connection.

For example, a signal may be exchanged between the first chip 202 and the second chip 204 on a signal path having a particular length (e.g. a signal path leading from the through-via 222-1 via one interconnect of the plurality of interconnects 202IR-1 to the second chip 204), and an identical signal may be exchanged between the first chip 202 and the second chip 204 on a backup signal path having a different length (e.g. a signal path leading from the through-via 222-1 via another interconnect of the plurality of interconnects 202IR-1 to the second chip 204). In such an example, fusing may be applied to select between the signal path and the backup signal path.

Whilst the provision of more than one signal path for a respective through-via 222-1, 222-5 may increase the yield of the chip arrangement 300 and/or the chip arrangement 400, it may be desirable to disconnect a non-functioning connection (e.g. electrical connection) between the first chip 202 and the second chip 204.

Accordingly, a chip arrangement may include at least one fuse, which may, for example, be blown to disconnect at least one non-functioning connection (e.g. electrical connection) between the first chip 202 and the second chip 204 and/or select between a signal path and its backup signal path.

Fusing may, for example, be performed after a test (e.g. electrical test) of the plurality of interconnects 202IR-1, 202IR-5, which may, for example, indicate functioning and non-functioning connections (e.g. electrical connections) or interconnects between the first chip 202 and the second chip 204. Based on the test, it may, for example, be possible to determine a most suitable connection or interconnect of the multiple connections or interconnects and then eliminate less suitable connections or interconnects of the multiple connections or interconnects by fusing.

Figure 5:
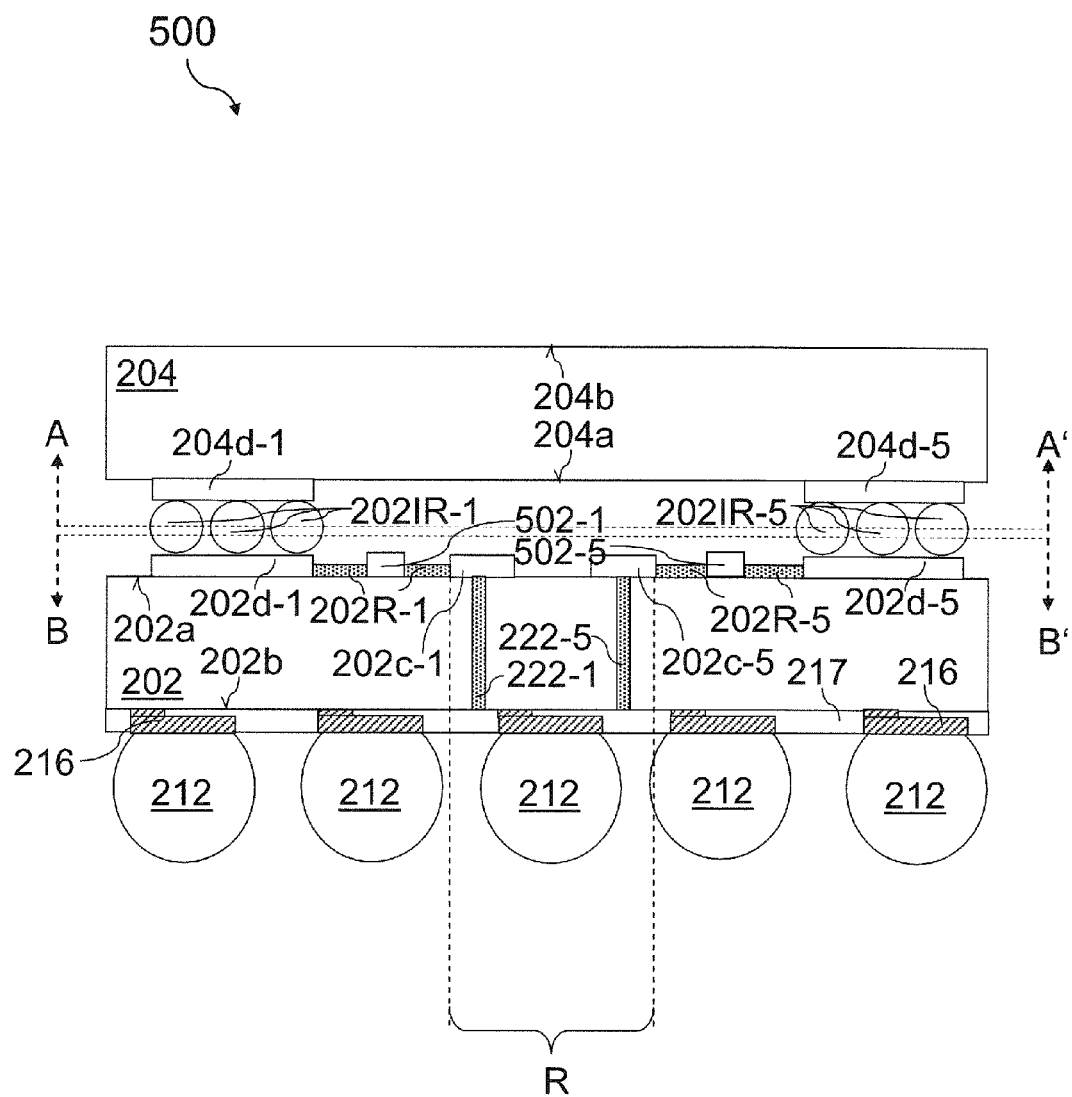
FIG. 5 shows a chip arrangement including a first chip, a second chip, and at least one fuse.

FIG. 5 shows a chip arrangement 500 including the first chip 202, the second chip 204, and at least one fuse 502-1, 502-5.

Reference signs in FIG. 5 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 500 shown in FIG. 5. Differences between FIG. 5 and FIG. 3 are described below.

The chip arrangement 500 may include at least one fuse 502-1, 502-5 that may be coupled (e.g. electrically coupled) between the plurality of interconnects 202IR-1, 202IR-5 and the first contact 202c-1, 202c-5 of the first chip 202. For example, in the chip arrangement 500 shown in FIG. 5, the at least one fuse 502-1 may, for example, be included in the at least one redistribution structure 202R-1 and may be coupled between the plurality of interconnects 202IR-1 and the first contact 202c-1 of the first chip 202. In the chip arrangement 500 shown in FIG. 5, the at least one fuse 502-5 may, for example, be included in the at least one redistribution structure 202R-5 and may be coupled between the plurality of interconnects 202IR-5 and the first contact 202c-5 of the first chip 202. As described above, fusing may enable an elimination of less suitable connections or interconnects of multiple connections or interconnects between the first chip 202 and the second chip 204. In this regard, the at least one fuse 502-1, 502-5 may be blown, thus interrupting the connection (e.g. electrical connection) between the plurality of interconnects 202IR-1, 202IR-5 and the first contact 202c-1, 202c-5 of the first chip 202, which may consequently eliminate a connection (e.g. electrical connection) between the first chip 202 and the second chip 204.

Alternatively or in addition, the chip arrangement 500 may include at least one fuse that may be coupled (e.g. electrically coupled) between the plurality of interconnects 202IR-1, 202IR-5 and a circuit (e.g. memory circuit) included in the second chip 204 (see description below, e.g. in relation to FIG. 7).

The at least one fuse may, for example, include or be an e-fuse (electrically programmable fuse) that may be blown by an electrical current. The at least one fuse may, for example, include or be a laser fuse that may be blown by a laser. The laser fuse may, for example, be disposed over the surface (e.g. the first surface 202a) of the first chip 202 and/or the second chip 204 and may, for example, be included in the redistribution structure 202R-1, 202R-5, as described above.

Figure 6:
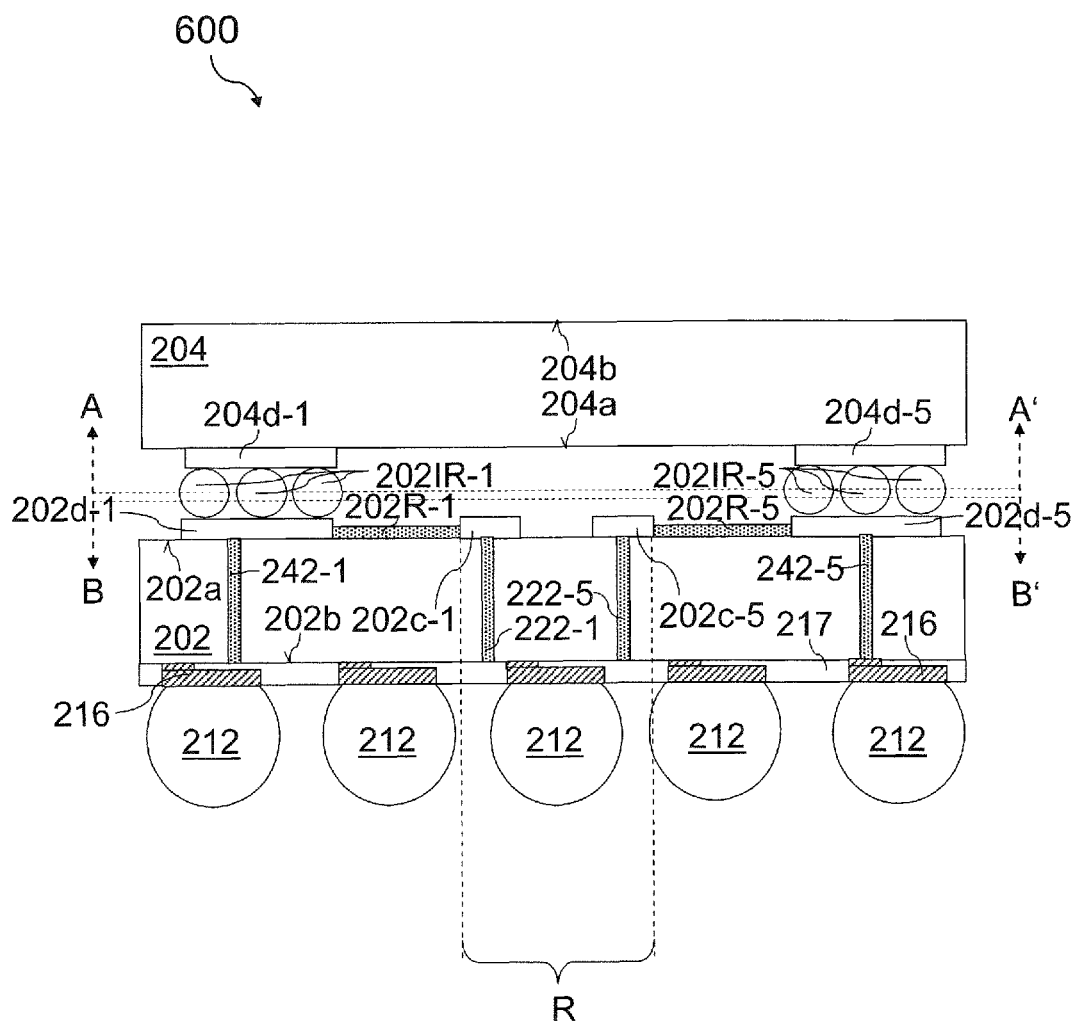
FIG. 6 shows a chip arrangement including a first chip, which may include a first through-via and a second through-via.

FIG. 6 shows a chip arrangement 600 including the first chip 202, which may include at least one first through-via 222-1, 222-5 and at least one second through-via 242-1, 242-5.

Reference signs in FIG. 6 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 600 shown in FIG. 6. Differences between FIG. 6 and FIG. 3 are described below.

As shown in FIG. 6, the first chip 202 may further include at least one second through-via 242-1, 242-5 that may, for example, extend from the second side 202b to the first side 202a of the first chip 202, or vice versa.

The at least one second through-via 242-1, 242-5 may be coupled (e.g. electrically coupled) to the at least one second contact 202d-1, 202d-5 formed at (e.g. disposed at or over) the first side 202a of the first chip 202.

The at least one second through-via 242-1, 242-5 may be disposed under the at least one second contact 202d-1, 202d-5. For example, the second through-via 242-1 and the second through-via 242-5 may be disposed under the second contact 202d-1 and the second contact 202d-5 of the first chip 202, respectively. In other words, the at least one second contact 202d-1, 202d-5 may be disposed over the at least one second through-via 242-1, 242-5.

The at least one second through-via 242-1, 242-5 that may be disposed under the at least one second contact 202d-1, 202d-5 may be in contact (e.g. in physical contact with, for example, in direct physical contact with) with the at least one second contact 202d-1, 202d-5 of the first chip 202, as shown in FIG. 6.

As described above, at least one contact 202c-1, 202c-5 of the first chip 202 may be rerouted from the region R that may be located at or near a center of the first chip 202 to another area (e.g. peripheral area or edge area) of the first chip 202 (e.g. by means of the at least one redistribution structure 202R-1, 202R-5). The at least one second contact 202d-1, 202d-5 of the first chip 202 that may be coupled to the at least one contact 202c-1, 202c-5 of the first chip 202 via the redistribution structure 202R-1, 202R-5 may be placed at any position on the first chip 202 that may be outside the region R. As shown in FIG. 6, the at least one second through-via 242-1, 242-5 may be disposed under the at least one second contact 202d-1, 202d-5. Accordingly, the at least one second through-via 242-1, 242-5 may be located at any position in the first chip 202 that may be outside the region R.

The at least one second through-via 242-1, 242-5 may, for example, include, or may consist of, at least one electrically conductive material selected from a group of electrically conductive materials. The group of electrically conductive materials may include, or may consist of, a metal or metal alloy. For example, the group may consist of: aluminum, copper, tungsten, titanium, nickel, gold, conductive paste (e.g. a polymer filled with conductive particles) and doped silicon, although other electrically conductive materials may be possible as well.

An effect (e.g. an additional effect) provided by the chip arrangement 600 shown in FIG. 6 may be the provision of one or more backup through-vias 242-1, 242-5 in the first chip 202 (e.g. logic chip). An effect (e.g. an additional effect) provided by the chip arrangement 600 shown in FIG. 6 (e.g. by the at least one second through-via 242-1, 242-5) may be better electrical performance of the chip arrangement 600.

Figure 7:
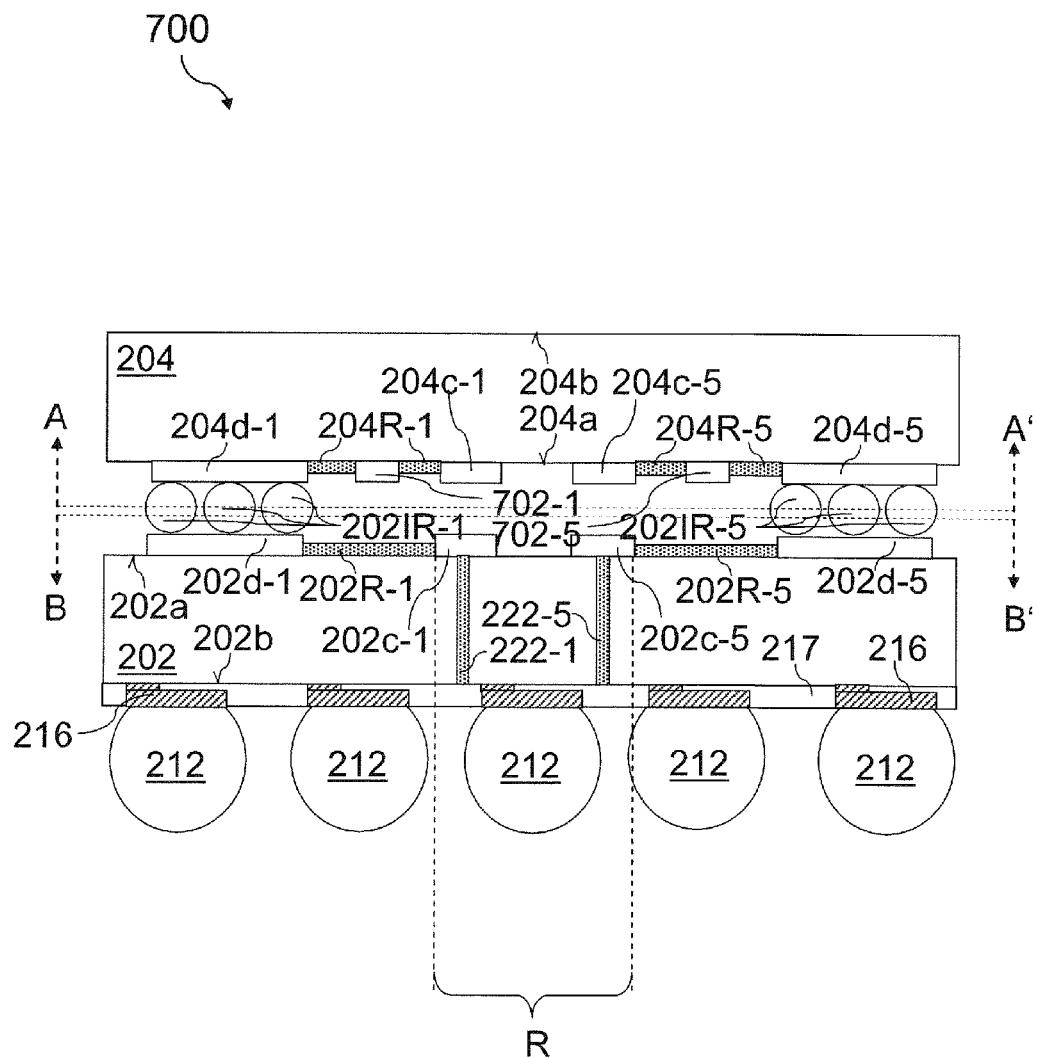
FIG. 7 shows a chip arrangement including a second chip, which may include a contact, a second contact, and a redistribution structure.

FIG. 7 shows a chip arrangement 700 including the second chip 204, which may include the at least one contact 204d-1, 204d-5. The at least one contact 204d-1, 204d-5 may be at least one second contact of the second chip 204. The chip arrangement may further include at least one first contact 204c-1, 204c-5, and at least one redistribution structure 204R-1, 204R-5 electrically coupling the at least one first contact 204c-1, 204c-5 to the at least one second contact 204d-1, 204d-5.

Reference signs in FIG. 7 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 700 shown in FIG. 7. Differences between FIG. 7 and FIG. 3 are described below.

In the chip arrangement 700 shown in FIG. 7, the second chip 204 may, for example, be identified with the chip 20X shown in FIG. 2. In particular, the view 200 shown in FIG. 2 may be a view of the chip arrangement 700 along the line A-A' shown in FIG. 7. By way of another example, the second chip 204 shown in FIG. 7 may be a view of the chip 20X shown in FIG. 2 along the line C-C' shown in FIG. 2. Accordingly, the various effects described above in relation to the chip 20X shown in FIG. 2 may be analogously valid for the chip arrangement 700 shown in FIG. 7.

As shown in FIG. 7, the second chip 204 may include the at least one (second) contact 204d-1, 204d-5 and may further include at least one first contact 204c-1, 204c-5.

The at least one first contact 204c-1, 204c-5 of the second chip 204 may include, or may consist of, at least one electrically conductive material selected from a group of electrically conductive materials. The group of electrically conductive materials may consist of: a metal or a metal alloy, although other electrically conductive materials may be possible as well. For example, the at least one first contact 204c-1, 204c-5 may include, or may consist of, copper, nickel, gold, palladium, titanium, chrome, tungsten or aluminum or a metal alloy or metal stack including one or more of the above mentioned materials.

The second chip 204 may further include at least one redistribution structure 204R-1, 204R-5. For example, the redistribution structure 204R-1 and the redistribution structure 204R-5 of the second chip 202 may be identified with the redistribution structure 20XR-1 and the redistribution structure 20XR-1 of the chip 20X shown in FIG. 2, respectively.

The at least one redistribution structure 204R-1, 204R-5 may couple (e.g. electrically couple) the at least one first contact 204c-1, 204c-5 to the at least one second contact 204d-1, 204d-5 of the second chip 204. For example, the at least one redistribution structure 204R-1, 204R-5 may redistribute and/or re-map electrical connections from the at least one first contact 204c-1, 204c-5 of the second chip 204 to the at least one second contact 204d-1, 204d-5 of the second chip 204, or vice versa.

The at least one redistribution structure 204R-1, 204R-5 may include a redistribution layer (RDL) that may, for example, be disposed at the first side 204a of the second chip 204. The at least one redistribution structure 204R-1, 204R-5 (e.g. RDL) may, for example, include, or may be, a single-level (e.g. a single layer) RDL. The at least one redistribution structure 204R-1, 204R-5 (e.g. RDL) may, for example, include, or may be, a multi-level (e.g. a multi-layer) RDL.

The at least one redistribution structure 204R-1, 204R-5 disposed at the first side 204a (e.g. frontside) of the second chip 204 may include, or may be, a front-end metallization layer of the second chip 204, and may for example be realized in one or more of the last chip metals (e.g. Metal-N and/or Metal-(N−1) and/or Metal-(N−2), etc.). Alternatively, the at least one redistribution structure 204R-1, 204R-5 may be realized as a redistribution layer that is formed after completion of front-end metal and passivation layers.

The at least one redistribution structure 204R-1, 204R-5 may include, or may consist of, at least one electrically conductive material selected from a group of electrically conductive materials. The group of electrically conductive materials may consist of: a metal or a metal alloy, although other electrically conductive materials may be possible as well. For example, the at least one redistribution structure 204R-1, 204R-5 may include, or may consist of, copper, nickel, gold, palladium, titanium, chrome, tungsten or aluminum or a metal alloy or metal stack including one or more of the above mentioned materials.

As shown in FIG. 7, at least one interconnect of the plurality of interconnects 202IR-1 may be in contact (e.g. in physical contact, e.g. in direct physical contact) with the second contact 202$d$-1 of the first chip 202 and the second contact 204$d$-1 of the second chip 204. Similarly, at least one interconnect of the plurality of interconnects 202IR-5 may be in contact (e.g. in physical contact, e.g. in direct physical contact) with the second contact 202$d$-5 of the first chip 202 and the second contact 204$d$-5 of the second chip 204. That is, at least one interconnect of a respective plurality of interconnects 202IR-x may be in contact (e.g. in physical contact, e.g. in direct physical contact) with a respective second contact 202$d$-x of the first chip 202 and a respective second contact 204$d$-x of the second chip 204.

As described above in relation to FIG. 5, at least one fuse may be coupled (e.g. electrically coupled) between the plurality of interconnects 202IR-1, 202IR-5 and a circuit (e.g. memory circuit) included in the second chip 204. For example, as shown in the chip arrangement 700 shown in FIG. 7, the at least one fuse 702-1 may, for example, be included in the at least one redistribution structure 204R-1 and may be coupled between the plurality of interconnects 202IR-1 and the first contact 204$c$-1 of the second chip 202. In the chip arrangement 700 shown in FIG. 7, the at least one fuse 702-5 may, for example, be included in the at least one redistribution structure 204R-5 and may be coupled between the plurality of interconnects 202IR-5 and the first contact 204$c$-5 of the second chip 204. As described above, fusing may enable an elimination of less suitable connections or interconnects of multiple connections or interconnects between the first chip 202 and the second chip 204. In this regard, the at least one fuse 702-1, 702-5 may be blown, thus interrupting the connection (e.g. electrical connection) between the plurality of interconnects 202IR-1, 202IR-5 and the first contact 204$c$-1, 204$c$-5 of the second chip 204, which may consequently eliminate a connection (e.g. electrical connection) between the first chip 202 and the second chip 204 (e.g. a circuit (e.g. memory circuit) included in the second chip 204).

A chip arrangement of the chip arrangements 300 to 700 may be combined with at least one other chip arrangement of the chip arrangements 300 to 700 to form new chip arrangements.

Figure 8:
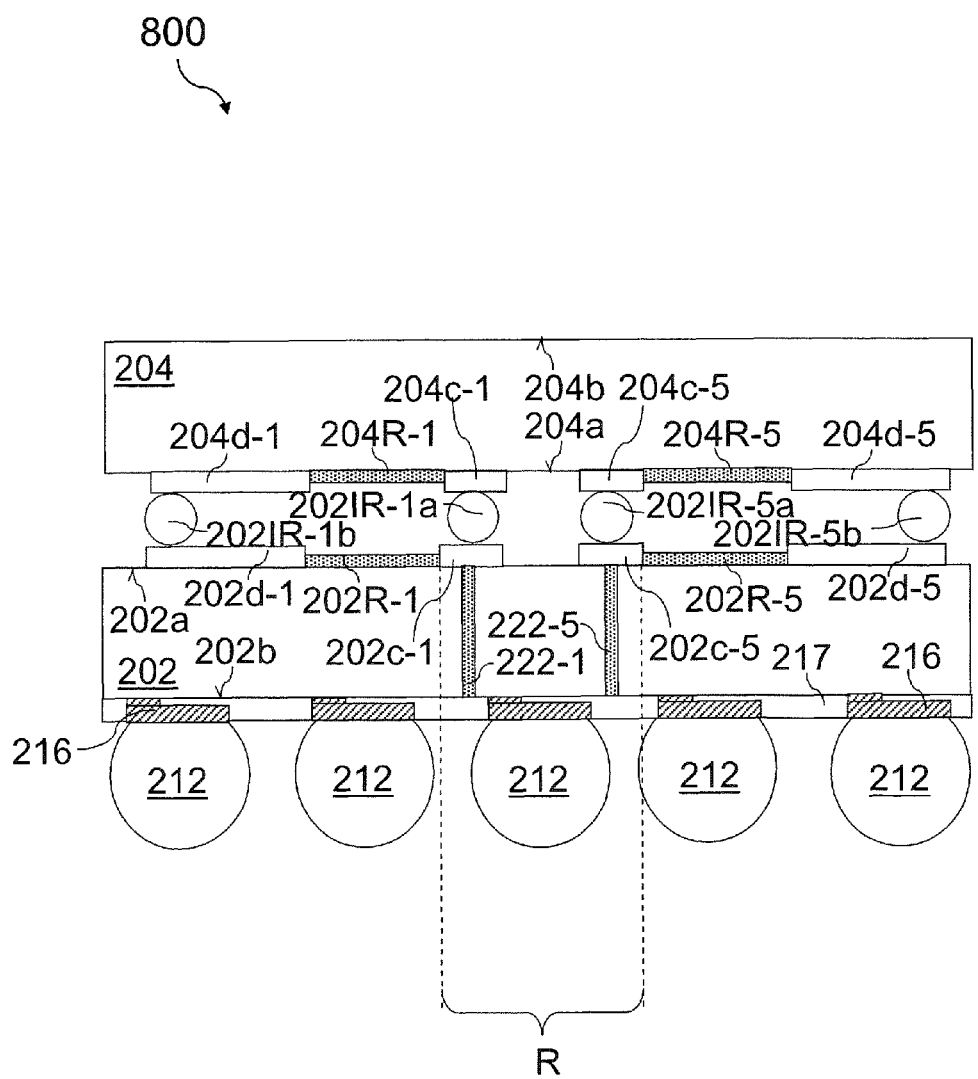
FIG. 8 shows a chip arrangement including a first chip and a second chip, each of which may include a first contact, a second contact and a redistribution structure.

One such arrangement is shown in FIG. 8.

FIG. 8 shows a chip arrangement 800 including the first chip 202 and the second chip 204, each of which may include at least one first contact, at least one second contact, and at least one redistribution structure.

Reference signs in FIG. 8 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 800 shown in FIG. 8. Differences between FIG. 8 and FIG. 3 are described below.

As shown in FIG. 8, the first chip 202 may include at least one first contact 202$c$-1, 202$c$-5, at least one second contact 202$d$-1, 202$d$-5, and at least one redistribution structure 202R-1, 202R-5 coupling (e.g. electrically coupling) the at least one first contact 202$c$-1, 202$c$-5 to the at least one second contact 202$d$-1, 202$d$-5.

As shown in FIG. 8, the second chip 204 may include at least one first contact 204$c$-1, 204$c$-5, at least one second contact 204$d$-1, 204$d$-5, and at least one redistribution structure 204R-1, 204R-5 coupling (e.g. electrically coupling) the at least one first contact 204$c$-1, 204$c$-5 to the at least one second contact 204$d$-1, 204$d$-5.

As shown in FIG. 8, the chip arrangement 800 may include at least one first interconnect 202IR-1$a$, 202IR-5$a$ that may be coupled (e.g. electrically coupled) to the at least one first contact 202$c$-1, 202$c$-5 of the first chip 202 and/or the at least one first contact 204$c$-1, 204$c$-5 of the second chip 204.

As shown in FIG. 8, the chip arrangement 800 may include at least one second interconnect 202IR-1$b$, 202IR-5$b$ that may be coupled (e.g. electrically coupled) to the at least one second contact 202$d$-1, 202$d$-5 of the first chip 202 and/or the at least one second contact 204$d$-1, 204$d$-5 of the second chip 204.

An effect provided by the chip arrangement 800 may be provision of one or more signal paths for a signal that may, for example, be exchanged via a respective through-via 221-1, 222-5. Accordingly at least one of the at least one first interconnect 202IR-1$a$, 202IR-5$a$ and the at least one second interconnect 202IR-1$b$, 202IR-5$b$ may couple (e.g. electrically couple) the at least one first contact 202$c$-1, 202$c$-5 of the first chip 202 to the at least one first contact 204$c$-1, 204$c$-5 of the second chip 204.

For example, a signal may propagate along a path including the through-via 222-1, the first contact 202$c$-1 of the first chip 202, the first interconnect 202IR-1$a$ and the first contact 204$c$-1 of the second chip 202, thus coupling the first contact 202$c$-1 of the first chip 202 to the first contact 204$c$-1 of the second chip 204.

The signal may propagate along another path including the through-via 222-1, the first contact 202$c$-1 of the first chip 202, the redistribution structure 202R-1, the second contact 202$d$-1 of the first chip 202, the second interconnect 202IR-1$b$, the second contact 204$d$-1 of the second chip 204, the redistribution structure 204R-1 and the first contact 204$c$-1 of the second chip 204, thus coupling the first contact 202$c$-1 of the first chip 202 to the first contact 204$c$-1 of the second chip 204. The probability that at least one of the alternative signal paths is functioning may be higher compared to a conventional arrangement with only one signal path per signal.

According to one or more aspects, the present disclosure proposes to provide backup interconnects for not connected ones in a design of a chip arrangement.

According to one or more aspects, the present disclosure proposes to double, triple, quadruple, or multiply by five times or more, one or more interconnects (e.g. each interconnect) in a chip arrangement so as to, for example, provide a backup connection between a first chip and a second chip even if an interconnect between the first chip and the second chip may fail to connect the first chip and the second chip.

According to one or more aspects, the present disclosure proposes to improve yield by, for example, having at least one redistribution line in the first chip and/or the second chip.

According to one or more aspects, the present disclosure proposes to reroute at least one interconnect (e.g. all interconnects) from a center region of the first chip and/or the second chip to at least one interconnect area (e.g. peripheral area or edge area) of the first chip and/or the second chip.

According to one or more aspects, the present disclosure proposes a use of a first chip and/or a second chip that may be large enough to accommodate a plurality of blocks of interconnects on a surface of the first chip and/or the second chip.

According to one or more aspects, the present disclosure proposes connecting original interconnects and backup interconnects during a stacking process that may, for example, stack a first chip onto a second chip, or vice versa.

According to one or more aspects, the present disclosure proposes that each original interconnect have at least one backup interconnect that may, for example, take over an interconnect function in case the original interconnect fails to connect a first chip and a second chip to each other.

According to one or more aspects, the present disclosure proposes arranging at least one backup interconnect at any position between a first chip and a second chip.

According to one or more aspects, the present disclosure proposes arranging at least one backup interconnect at an edge of a first chip and/or a second chip.

According to one or more aspects, the present disclosure proposes backing up each original interconnect twice, three-times, four-times, five-times or even more times.

According to one or more aspects, the present disclosure proposes backing up at least one original interconnect twice, three-times, four-times, five-times or even more times.

According to one or more aspects, the present disclosure proposes applying fusing to select between an electrical connection and its backup electrical connection.

According to one or more aspects, the present disclosure proposes a use of a fuse, e.g. a laser fuse or an e-fuse, to select between an electrical connection and its backup electrical connection.

According to various examples presented herein, a chip arrangement may be provided. The chip arrangement may include: a first chip including a first contact, a second contact, and a redistribution structure electrically coupling the first contact to the second contact; a second chip including a contact; and a plurality of interconnects electrically coupled to the second contact of the first chip, wherein at least one interconnect of the plurality of interconnects electrically may couple the second contact of the first chip to the contact of the second chip.

The plurality of interconnects may include a plurality of bumps.

The first contact and/or the second contact of the first chip may include or may be a pad.

The contact of the second chip may include or may be a pad.

The first chip may be a logic chip.

The second chip may be a memory chip.

The plurality of interconnects may be disposed between the first chip and the second chip.

The contact of the second chip may be a second contact of the second chip, and the second chip may further include: a first contact and a redistribution structure electrically coupling the first contact of the second chip to the second contact of the second chip, wherein the at least one interconnect of the plurality of interconnects that electrically couples the second contact of the first chip to the contact of the second chip may be in contact with the second contact of the first chip and the second contact of the second chip.

The first contact and/or the second contact of the second chip may include or may be a pad.

The first chip may include a through-via electrically coupled with the first contact.

The first chip may include a second through-via electrically coupled with the second contact.

The first chip may include a first through-via electrically coupled to the first contact and a second through-via electrically coupled to the second contact, wherein the first contact may be disposed over the first through-via and the second contact is disposed over the second through-via.

The redistribution structure may include a redistribution layer disposed at a surface of the first chip.

The redistribution structure may include at least one electrically conductive material.

The redistribution structure may include a front-end metallization layer of the first chip.

The redistribution structure of the second chip may include a redistribution layer disposed at a surface of the second chip.

The redistribution structure of the second chip may include at least one electrically conductive material.

The redistribution structure of the second chip may include a front-end metallization layer of the second chip.

The chip arrangement may include at least one fuse electrically coupled between the plurality of interconnects and a circuit included in the first chip.

The chip arrangement may include at least one fuse electrically coupled between the plurality of interconnects and the first contact of the first chip.

The chip arrangement may include at least one fuse electrically coupled between the first contact of the first chip and the second contact of the second chip.

The chip arrangement may include at least one fuse electrically coupled between the plurality of interconnects and a circuit included in the second chip.

The chip arrangement may include at least one fuse electrically coupled between the plurality of interconnects and the first contact of the second chip.

The chip arrangement may include at least one fuse electrically coupled between the first contact of the second chip and the second contact of the second chip.

According to various examples presented herein, a chip arrangement may be provided. The chip arrangement may include: a first chip including a first contact, a second contact, and a redistribution structure electrically coupling the first contact to the second contact; a second chip including a contact; and a plurality of interconnects electrically coupled to the contact of the second chip, wherein at least one interconnect of the plurality of interconnects electrically may couple the contact of the second chip to the second contact of the first chip.

The first chip may be a logic chip.

The second chip may be a memory chip.

The contact of the second chip may be a second contact of the second chip and the second chip may further include: a first contact and a redistribution structure electrically coupling the first contact of the second chip to the second contact of the second chip, wherein the at least one interconnect of the plurality of interconnects that electrically couples the contact of the second chip to the second contact of the first chip may be in contact with the second contact of the second chip and the second contact of the first chip.

According to various examples presented herein, a chip arrangement may be provided. The chip arrangement may include: a first chip including a first contact, a second contact, and a redistribution structure electrically coupling the first contact to the second contact; a second chip including a first contact, a second contact, and a redistribution structure electrically coupling the first contact to the second contact; a first interconnect electrically coupled to at least one of the first contact of the first chip and the first contact of the second chip;

a second interconnect electrically coupled to at least one of the second contact of the first chip and the second contact of the second chip, wherein at least one of the first interconnect and the second interconnect may electrically couple the first contact of the first chip to the first contact of the second chip.

The first interconnect may be disposed between the first contact of the first chip and the first contact of the second chip; and the second interconnect may be disposed between the second contact of the first chip and the second contact of the second chip.

The first interconnect may be in contact with at least one of the first contact of the first chip and the first contact of the second chip; and the second interconnect may be in contact with at least one of the second contact of the first chip and the second contact of the second chip.

The chip arrangement may further include at least one fuse electrically coupled between the first contact and the second contact of the first chip.

The chip arrangement may further include at least one fuse electrically coupled between the first contact and the second contact of the second chip.

Various examples and aspects described in the context of one of the chip arrangements or chip packages or methods described herein may be analogously valid for the other chip arrangements or chip packages or methods described herein.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A chip arrangement, comprising:
a first chip comprising a first contact, a second contact, and a redistribution structure electrically coupling the first contact to the second contact;
a second chip comprising a contact; and
a plurality of interconnects electrically coupled to the second contact of the first chip, wherein at least one interconnect of the plurality of interconnects electrically couples the second contact of the first chip to the contact of the second chip, wherein the redistribution structure comprises a front-end metallization layer of the first chip.

2. The chip arrangement of claim 1,
wherein the plurality of interconnects comprises a plurality of bumps.

3. The chip arrangement of claim 1,
wherein the first chip is a logic chip.

4. The chip arrangement of claim 1,
wherein the second chip is a memory chip.

5. The chip arrangement of claim 1, wherein the plurality of interconnects is disposed between the first chip and the second chip.

6. The chip arrangement of claim 1,
wherein the contact of the second chip is a second contact of the second chip,
wherein the second chip further comprises:
a first contact and a redistribution structure electrically coupling the first contact of the second chip to the second contact of the second chip,
wherein the at least one interconnect of the plurality of interconnects that electrically couples the second contact of the first chip to the contact of the second chip is in contact with the second contact of the first chip and the second contact of the second chip.

7. The chip arrangement of claim 1,
wherein the first chip comprises a through-via electrically coupled with the first contact.

8. The chip arrangement of claim 7,
wherein the first chip comprises a second through-via electrically coupled with the second contact.

9. The chip arrangement of claim 1,
wherein the first chip comprises a first through-via electrically coupled to the first contact and a second through-via electrically coupled to the second contact,
wherein the first contact is disposed over the first through-via and the second contact is disposed over the second through-via.

10. The chip arrangement of claim 1,
wherein the redistribution structure comprises a redistribution layer disposed at a surface of the first chip.

11. The chip arrangement of claim 6,
wherein the redistribution structure of the second chip comprises a redistribution layer disposed at a surface of the second chip.

12. The chip arrangement of claim 6,
wherein the redistribution structure of the second chip comprises a front-end metallization layer of the second chip.

13. The chip arrangement of claim 1,
further comprising at least one fuse electrically coupled between the plurality of interconnects and the second contact of the first chip.

14. The chip arrangement of claim 1,
further comprising at least one fuse electrically coupled between the plurality of interconnects and a circuit included in the second chip.

15. The chip arrangement of claim 6,
further comprising at least one fuse electrically coupled between the plurality of interconnects and the first contact of the first chip or the first contact of the second chip.

16. A chip arrangement, comprising:
a first chip comprising a first contact, a second contact, and a redistribution structure electrically coupling the first contact to the second contact;
a second chip comprising a contact; and
a plurality of interconnects electrically coupled to the contact of the second chip, wherein at least one interconnect of the plurality of interconnects electrically couples the contact of the second chip to the second contact of the first chip,
wherein the redistribution structure comprises a front-end metallization layer of the first chip.

17. The chip arrangement of claim 16,
wherein the first chip is a logic chip.

18. The chip arrangement of claim 16,
wherein the second chip is a memory chip.

19. The chip arrangement of claim 16,
wherein the contact of the second chip is a second contact of the second chip, wherein the second chip further comprises:
a first contact and a redistribution structure electrically coupling the first contact of the second chip to the second contact of the second chip,
wherein the at least one interconnect of the plurality of interconnects that electrically couples the contact of the second chip to the second contact of the first chip is in contact with the second contact of the second chip and the second contact of the first chip.

20. A chip arrangement, comprising:
- a first chip comprising a first contact, a second contact, a redistribution structure electrically coupling the first contact to the second contact, and at least one fuse electrically coupled between the first contact and the second contact;
- a second chip comprising a first contact, a second contact, and a redistribution structure electrically coupling the first contact to the second contact;
- a first interconnect electrically coupled to at least one of the first contact of the first chip and the first contact of the second chip;
- a second interconnect electrically coupled to at least one of the second contact of the first chip and the second contact of the second chip,
- wherein at least one of the first interconnect and the second interconnect electrically couples the first contact of the first chip to the first contact of the second chip.

21. The chip arrangement of claim 20,
- wherein the first interconnect is disposed between the first contact of the first chip and the first contact of the second chip; and
- wherein the second interconnect is disposed between the second contact of the first chip and the second contact of the second chip.

22. The chip arrangement of claim 20,
- wherein the first interconnect is in contact with at least one of the first contact of the first chip and the first contact of the second chip; and
- wherein the second interconnect is in contact with at least one of the second contact of the first chip and the second contact of the second chip.

23. The chip arrangement of claim 20,
- further comprising at least one fuse electrically coupled between the first contact and the second contact of the second chip.

* * * * *